(12) United States Patent
Yang et al.

(10) Patent No.: US 12,310,186 B2
(45) Date of Patent: May 20, 2025

(54) ELECTROLUMINESCENT DISPLAY DEVICE

(71) Applicant: LG Display Co., Ltd., Seoul (KR)

(72) Inventors: Suk Yang, Seoul (KR); Heesuk Pang, Paju-si (KR); JooHwan Shin, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 447 days.

(21) Appl. No.: 17/838,053

(22) Filed: Jun. 10, 2022

(65) Prior Publication Data

US 2022/0406861 A1 Dec. 22, 2022

(30) Foreign Application Priority Data

Jun. 18, 2021 (KR) .......................... 10-2021-0079413

(51) Int. Cl.
*H10K 59/124* (2023.01)
*H10K 59/122* (2023.01)
*H10K 59/131* (2023.01)

(52) U.S. Cl.
CPC ......... *H10K 59/122* (2023.02); *H10K 59/131* (2023.02)

(58) Field of Classification Search
CPC .. H10K 59/122; H10K 59/124; H10K 59/131; H10K 59/873
USPC .......................................................... 257/8
See application file for complete search history.

(56) References Cited

U.S. PATENT DOCUMENTS

| 10,622,585 | B2 | 4/2020 | Kim et al. |
| 10,978,672 | B2 | 4/2021 | Lee et al. |
| 11,322,564 | B2 | 5/2022 | Son et al. |
| 2016/0043341 | A1* | 2/2016 | Heo ............... H01L 27/1225 438/23 |
| 2018/0159074 | A1 | 6/2018 | Kim et al. |
| 2020/0006701 | A1 | 1/2020 | Lee et al. |
| 2020/0144342 | A1* | 5/2020 | Shim ............. H10K 50/81 |

(Continued)

FOREIGN PATENT DOCUMENTS

| KR | 10-2017-0002985 A | 1/2017 |
| KR | 10-2017-0059864 A | 5/2017 |

(Continued)

OTHER PUBLICATIONS

Korean Intellectual Property Office, Office Action, Korean Patent Application No. 10-2021-0079413, Nov. 14, 2024, 24 pages.

*Primary Examiner* — Didarul A Mazumder
(74) *Attorney, Agent, or Firm* — Fenwick & West LLP

(57) ABSTRACT

An electroluminescent display device according to an exemplary embodiment of the present disclosure includes a display panel divided into a display area and a non-display area, a planarization layer and a bank extended to the non-display area of the display panel, an organic layer and a cathode disposed on the bank and extended to the non-display area of the display panel, a trench which is disposed in the non-display area outside the display area and from which the cathode, the organic layer, the bank and the planarization layer are removed; an under-cut structure which is disposed within the trench and composed of the bank and the planarization layer and in which the planarization layer retreats inwards from an end of the bank to generate an under-cut and an adhesive layer and an encapsulation substrate disposed on the cathode. Thus, reliability can be improved and a bezel width can be reduced.

18 Claims, 30 Drawing Sheets

(56) References Cited

U.S. PATENT DOCUMENTS

2020/0161397 A1* 5/2020 Pang .................... H10K 59/126
2020/0168683 A1   5/2020 Son et al.
2024/0023365 A1   1/2024 Choi et al.

FOREIGN PATENT DOCUMENTS

| KR | 10-2018-0065068 A | 6/2018 |
| KR | 10-2020-0003336 A | 1/2020 |
| KR | 10-2020-0060002 A | 5/2020 |
| KR | 10-2021-0001055 A | 1/2021 |

* cited by examiner

ELECTROLUMINESCENT DISPLAY DEVICE

CROSS-REFERENCE TO RELATED APPLICATION

This application claims the priority of Republic of Korea Patent Application No. 10-2021-0079413 filed on Jun. 18, 2021, in the Korean Intellectual Property Office, the disclosure of which is hereby incorporated by reference in its entirety.

BACKGROUND

Technical Field

The present disclosure relates to an electroluminescent display device, and more particularly, to an electroluminescent display device having a narrow bezel.

Description of the Related Art

With the advent of the information age, display technology for visually displaying electrical information signals is under rapid development. Accordingly, efforts to decrease the volume, weight and power consumption of various display devices have been made.

Representative display devices may include a liquid crystal display device (LCD), an electro-wetting display device (EWD), an organic light emitting display device (OLED) and the like.

An electroluminescent display device including the organic light emitting display device is a self-emitting display device, in which a separate light source is not necessary, which is different from the liquid crystal display device. Therefore, the electroluminescent display device can be manufactured to be thin and light. Further, the electroluminescent display device is advantageous not only in power consumption but also in color implementation, a response speed, a viewing angle and a contrast ratio (CR) due to the lower voltage driving. Thus, it is expected to be utilized in various fields.

In the electroluminescent display device, an emission layer using an organic material is disposed between two electrodes composed of an anode and a cathode. Further, when holes in the anode are injected to the emission layer and electrons in the cathode are injected to the emission layer, the injected holes and electrons are recombined and form excitons in the emission layer to emit light.

SUMMARY

Currently, in an electroluminescent display device, a minimum bezel distance is needed to secure reliability such as moisture permeation resistance or the like. Such a minimum bezel distance may be referred to as "reliable bezel". The reliable bezel may be defined from an end of an upper substrate (encapsulation substrate) to an end of a cathode.

Meanwhile, with an increasing demand for a slimmer display device, the demand for a slimmer non-display area except a display area where an image is displayed is also increasing. However, a cathode needs to be formed to cover an organic layer in order to suppress failure in mass production caused by exposure of the organic layer. Accordingly, there is a limitation in securing the reliable bezel.

One or more embodiments of the present disclosure provide an electroluminescent display device to which an under-cut structure is applied to block a lateral moisture permeation route. In the electroluminescent display device, an end of a cathode retreats to a display area to increase a reliable bezel and thus reduce a bezel width.

The technical benefits of the present disclosure are not limited to the above-mentioned benefits, and other benefits, which are not mentioned above, can be clearly understood by those skilled in the art from the following descriptions.

According to one embodiment of the present disclosure, the electroluminescent display device includes a display panel divided into a display area and a non-display area. Also, the electroluminescent display device includes a planarization layer and a bank extended to the non-display area of the display panel. Further, the electroluminescent display device includes an organic layer and a cathode disposed on the bank and extended to the non-display area of the display panel. Furthermore, the electroluminescent display device includes a trench which is disposed in the non-display area outside the display area and from which the cathode, the organic layer, the bank and the planarization layer are removed. Moreover, the electroluminescent display device may include an under-cut structure which is disposed within the trench and composed of the bank and the planarization layer and in which the planarization layer retreats inwards from an end of the bank to generate an under-cut. Also, the electroluminescent display device may include an adhesive layer and an encapsulation substrate disposed on the cathode.

Other detailed matters of the exemplary embodiments are included in the detailed description and the drawings.

According to the present disclosure, an under-cut structure is applied between a display area and a non-display area to block a lateral moisture permeation route and suppress exposure of the lateral surface of an organic layer caused by a step coverage between a cathode and the organic layer. Thus, reliability can be improved and a bezel width can be reduced.

According to the present disclosure, an end of a cathode retreats from a bezel area to a display area to increase a reliable bezel. Thus, a bezel width can be reduced.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
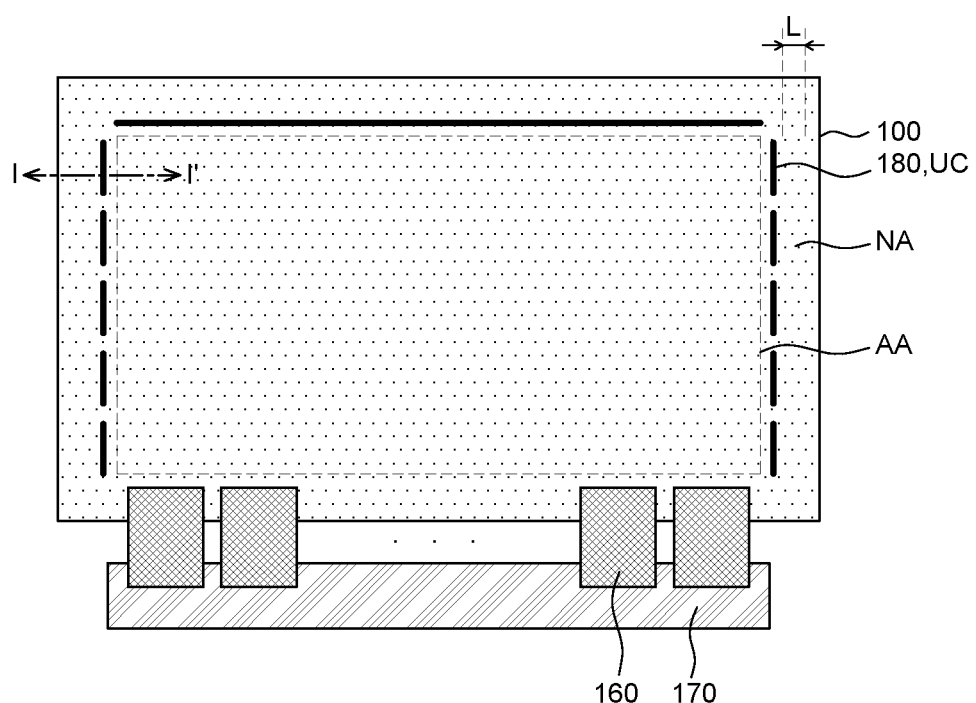
FIG. 1 is a plan view illustrating an electroluminescent display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

FIG. 1 is a plan view illustrating an electroluminescent display device according to a first exemplary embodiment of the present disclosure.

Referring to FIG. 1, the electroluminescent display device according to the first exemplary embodiment of the present disclosure may include a display panel 100, a flexible film 160, and a printed circuit board 170.

The display panel 100 is a panel for displaying an image to a user.

In the display panel 100, a display element for displaying an image, a driving element for driving the display element and a line for transferring various signals to the display element and the driving element may be disposed. The display element may be defined variously depending on the type of the display panel 100. For example, if the display panel 100 is an organic light emitting display panel, the display element may be an organic light emitting diode which includes an anode, an organic emission layer and a cathode.

Hereinafter, even though the display panel 100 is assumed as an organic light emitting display panel, the display panel 100 is not limited to the organic light emitting display panel.

The display panel 100 may include a display area AA and a non-display area NA.

The display area AA is an area where an image is displayed in the display panel 100.

In the display area AA, a plurality of sub-pixels forming a plurality of pixels and a circuit for driving the plurality of sub-pixels may be disposed. The plurality of sub-pixels are minimum units for forming the display area AA and a display element may be disposed in each of the plurality of sub-pixels. Also, the plurality of sub-pixels may form a pixel. For example, an organic light emitting diode which includes an anode, an organic emission layer and a cathode may be disposed in each of the plurality of sub-pixels, but the present disclosure is not limited thereto. Further, the circuit for driving the plurality of sub-pixels may include a driving element, a line, and the like. For example, the circuit may be configured by a thin film transistor, a storage capacitor, a gate line, a data line and the like, but is not limited thereto.

The non-display area NA is an area where no image is displayed.

FIG. 1 illustrates that the non-display area NA surrounds the rectangular display area AA. However, the shape and layout of the display area AA and the non-display area NA are not limited to the example shown in FIG. 1.

In other words, the display area AA and the non-display area NA may have the shapes suitable for a design of an electronic device equipped with the electroluminescent display device. Another exemplary shape of the display area AA may be, for example, a pentagonal shape, a hexagonal shape, a circular shape, an oval shape and the like.

In the non-display area NA, various lines and circuits for driving the organic light emitting diode of the display area AA may be disposed. For example, in the non-display area NA, a link line for transferring signals to a plurality of sub-pixels and circuits in the display area AA or a driver IC such as a gate driver IC or a data driver IC may be disposed. However, the present disclosure is not limited thereto.

Meanwhile, the left and right sides in FIG. 1 may be defined as a gate pad area where the gate driver IC is disposed. The bottom side in FIG. 1 may be defined as a data pad area connected to the flexible film 160. However, the present disclosure is not limited thereto.

The electroluminescent display device may include various additional components configured to generate various signals or drive pixels in the display area AA. An additional component for driving the pixels may include an inverter circuit, a multiplexer, an electrostatic discharge (ESD) circuit and the like. The electroluminescent display device may also include an additional component associated with a function other than the function of driving pixels. For example, the electroluminescent display device may include additional components that provide a touch sensing function, a user authorization function (e.g., fingerprint recognition), a multi-level pressure sensing function, a tactile feedback function and the like. The above-described additional components may be located in the non-display area NA and/or an external circuit connected to a connection interface.

The flexible film 160 is a film in which various components are disposed on a base film having a malleability. Specifically, the flexible film 160 is configured to supply a signal to the plurality of sub-pixels and the circuit in the display area AA, and may be electrically connected to the display panel 100. The flexible film 160 may be disposed at one end of the non-display area NA of the display panel 100 and may supply a power voltage, a data voltage or the like to the plurality of sub-pixels and the circuit in the display area AA. Meanwhile, the number of flexible films 160 may vary depending on the design and is not limited thereto.

A driver integrated circuit (IC), such as a data driver IC, may be disposed on the flexible film 160. The driver IC is a component to process a data signal for displaying an image and a driving signal for processing the data signal. The driver IC may be disposed by a chip on glass (COG), chip on film (COF) or tape carrier package (TCP) technique depending on a mounting method.

The printed circuit board 170 may be disposed at one end of the flexible film 160 and connected to the flexible film 160. The printed circuit board 170 is a component to supply a signal to the driver IC. The printed circuit board 170 may supply various signals, such as a driving signal or a data signal, to the driver IC. For example, a data driver that generates data signals may be mounted on the printed circuit board 170. The generated data signals may be supplied to the plurality of sub-pixels and the circuit in the display panel 100 through the flexible film 160. The number of printed circuit boards 170 may vary variously depending on the design and is not limited thereto.

Meanwhile, the electroluminescent display device needs a threshold (e.g., minimum) bezel distance to secure reliability such as moisture permeation resistance or the like. Also, with an increasing demand for a slimmer display device, the demand for the slimmer non-display area NA except the display area AA where an image is displayed is also increasing. However, a cathode needs to be formed to cover the lateral surfaces of an organic layer in order to suppress failure in mass production caused by exposure of the organic layer. Accordingly, there is a limitation in securing a reliable bezel L.

In the first exemplary embodiment of the present disclosure, a trench 180 including an under-cut structure UC is formed in a shadow area within the non-display area NA. Thus, it is possible to suppress moisture permeation through a lateral surface. Since the moisture permeation through the lateral surface may be suppressed, an end of the cathode retreats toward the display area AA. Therefore, the reliable bezel L may be increased, and, thus, a bezel width may be reduced. The reliable bezel L may be defined from an end of an upper substrate (encapsulation substrate) to the end of the cathode. In the first exemplary embodiment of the present disclosure, the reliable bezel L may be spaced apart by a predetermined distance from the trench 180.

For reference, the shadow area refers to a part of the non-display area NA formed by a gap between a mask and a substrate when the cathode and the organic layer are deposited.

In the first exemplary embodiment of the present disclosure, the under-cut structure UC and the trench 180 may be formed on three sides of the non-display area NA except the lower side, (e.g., the data pad area) of the display panel 100 connected to the flexible film 160. However, the present disclosure is not limited thereto. That is, the data pad area includes a wide line area, and, thus, it is difficult to form the under-cut structure UC. Therefore, the under-cut structure UC and the trench 180 are not formed in the data pad area. However, the present disclosure is not limited thereto. Meanwhile, a gate line or the like does not pass through on the upper side of the non-display area NA among the three sides of the non-display area NA. Thus, the under-cut structure UC and the trench 180 on the upper side of the non-display area NA are formed as a single body. However, a gate line or the like passes through on the left and right sides of the non-display area NA, and, thus, the under-cut structure UC and the trench 180 on the left and right sides of the non-display area NA may be divided into a plurality of ones (in other words, a plurality of portions) by the gate line. However, the present disclosure is not limited thereto.

For example, the trench 180 including the under-cut structure UC may be formed by patterning a bank and a planarization layer in the shadow area outside the display area AA by a photolithography process. That is, the trench 180 including the under-cut structure UC may be formed using the porous planarization layer and the bank, and, thus, it is possible to block or at least reduce a lateral moisture permeation route. Also, the end of the cathode may retreat to the display area AA to increase the reliable bezel L and thus reduce the bezel width.

Various components of the electroluminescent display device including the under-cut structure UC and the trench 180 according to the first exemplary embodiment of the present disclosure will be described in detail with reference to FIG. 2 and FIG. 3.

Figure 2:
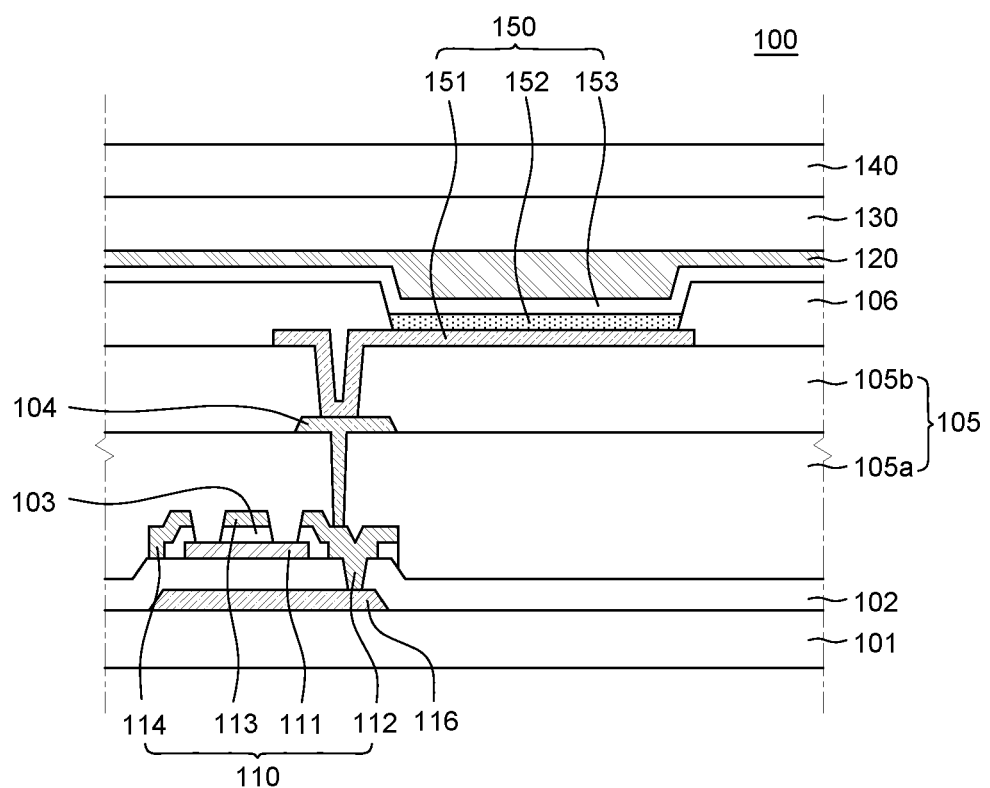
FIG. 2 is a cross-sectional view of a sub-pixel of the electroluminescent display device according to the first exemplary embodiment of the present disclosure.

FIG. 2 is a cross-sectional view of a sub-pixel of the electroluminescent display device according to the first exemplary embodiment of the present disclosure.

Figure 3:
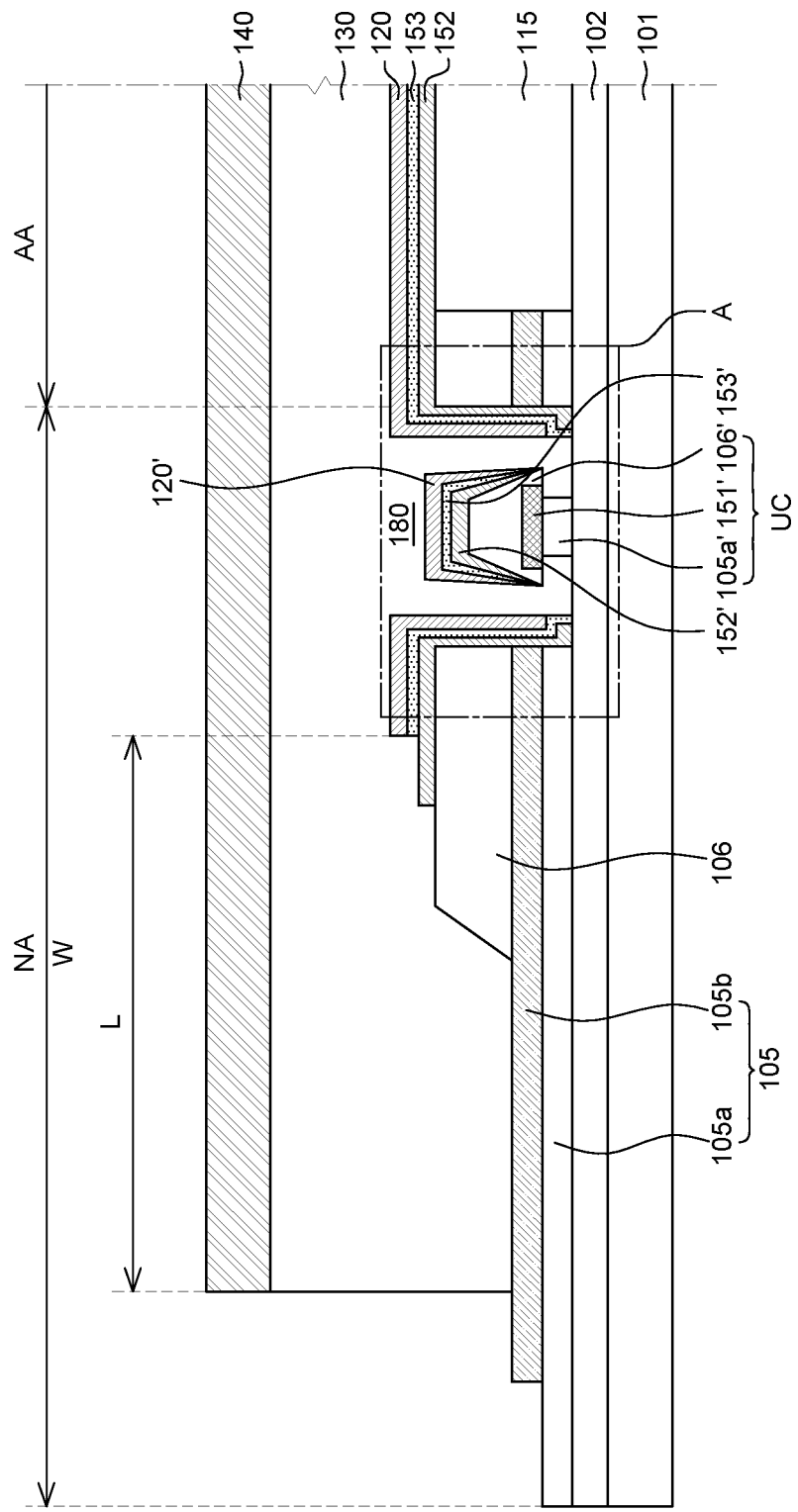
FIG. 3 is a cross-sectional view as taken along a line I-I' of FIG. 1 according to the first exemplary embodiment of the present disclosure.

FIG. 3 is a cross-sectional view as taken along a line I-I' of FIG. 1 according to the first exemplary embodiment of the present disclosure.

FIG. 3 shows a cross-sectional view of the left side of the display panel 100 on which the under-cut structure UC and the trench 180 are formed, (e.g., a part of the gate pad area as an example). For the convenience of description, FIG. 3 schematically illustrates a pixel part 115 within the display area AA. The pixel part 115 may include various components under an organic layer 152.

Referring to FIG. 2 and FIG. 3, in the electroluminescent display device according to the first exemplary embodiment of the present disclosure, a driving element 110 may be disposed on a substrate 101.

Also, a planarization layer 105 may be disposed on the driving element 110.

Further, an organic light emitting diode 150 electrically connected to the driving element 110 may be disposed on the planarization layer 105. A capping layer 120 may be disposed on the organic light emitting diode 150. Thus, permeation of oxygen and moisture into the organic light emitting diode 150 may be reduced.

An adhesive layer 130 and an encapsulation substrate 140 may be sequentially disposed on the capping layer 120. However, the present disclosure is not limited to this laminated structure.

The substrate 101 may be a glass or plastic substrate. If the substrate 101 is a plastic substrate, it may be made of a polyimide-based material or polycarbonate-based material and thus may have flexibility. In particular, polyimide may be applied to a high-temperature process and may be used for coating. Therefore, polyimide has been widely used for a plastic substrate.

A buffer layer 102 may be disposed on the substrate 101.

The buffer layer 102 is a functional layer configured to protect various electrodes and lines against impurities such as alkali ions flowing out from the substrate 101 or its lower layers. The buffer layer 102 may have a multilayered structure including a first buffer layer and a second buffer layer, but is not limited thereto. The buffer layer 102 may be made of silicon oxide (SiOx) or silicon nitride (SiNx), or may be formed as a multilayer thereof.

The buffer layer 102 may delay diffusion of moisture and/or oxygen permeating into the substrate 101. Also, the buffer layer 102 may include a multi buffer and/or an active buffer. The active buffer may function to protect an active layer 111 made of a semiconductor of the driving element 110 and block various types of defects flowing in from the substrate 101. The active buffer may be made of amorphous silicon (a-Si).

A light shielding layer 116 may be disposed between the substrate 101 and the buffer layer 102.

The light shielding layer 116 may be disposed on the substrate 101 at a position where the active layer 111 is to be formed. In particular, the light shielding layer 116 may be formed slightly larger than the active layer 111 so as to completely cover (e.g., overlap) the active layer 111. However, the present disclosure is not limited thereto.

The buffer layer 102 may be disposed on the entire surface of the substrate 101 on which the light shielding layer 116 has been formed.

The driving element 110 may be disposed on the buffer layer 102.

The driving element 110 may have a structure in which the active layer 111, an interlayer insulating layer 103, a gate electrode 113, a source electrode 114 and a drain electrode 112 are sequentially disposed. The driving element 110 may be electrically connected to the organic light emitting diode 150 through a connection electrode 104 to transfer a current or signal to the organic light emitting diode 150.

The active layer 111 may be located on the buffer layer 102. The active layer 111 may be made of polycrystalline silicon (p-Si) and in this case, a predetermined area may be doped with impurities. Alternatively, the active layer 111 may be made of amorphous silicon (a-Si), or may be made of various organic semiconductor materials such as pentacene. The active layer 111 may also be made of oxide.

The interlayer insulating layer 103 may be located on the active layer 111.

The interlayer insulating layer 103 may be made of an insulating inorganic material such as silicon oxide (SiOx) or silicon nitride (SiNx), and may also be made of an insulating organic material.

The gate electrode 113 may be located on the interlayer insulating layer 103. The gate electrode 113 may be made of various conductive materials such as magnesium (Mg), aluminum (Al), nickel (Ni), chromium (Cr), molybdenum (Mo), tungsten (W), gold (Au) or an alloy thereof.

The source electrode 114 and the drain electrode 112 may be formed as a single layer or a multilayered structure of an electrode material on the interlayer insulating layer 103. The source electrode 114 and the drain electrode 112 may be made of various conductive materials such as magnesium (Mg), aluminum (Al), nickel (Ni), chromium (Cr), molybdenum (Mo), tungsten (W), gold (Au) or an alloy thereof.

A passivation layer made of an inorganic insulating material may be further formed to cover the gate electrode 113, the source electrode 114 and the drain electrode 112.

The planarization layer 105 may be disposed on the driving element 110 configured as described above.

The planarization layer 105 may have a multilayered structure comprised of at least two layers. For example, the planarization layer 105 may include a first planarization layer 105a and a second planarization layer 105b. In this case, the first planarization layer 105a may be disposed to cover the driving element 110 and expose a part of the drain electrode 112 of the driving element 110.

The planarization layer 105 may be extended to the non-display area NA.

The planarization layer 105 may have a thickness of about 2 μm, but is not limited thereto.

The planarization layer 105 may include an overcoat layer, but is not limited thereto.

The second planarization layer 105b may be disposed to be spaced apart by a predetermined distance from an end of the substrate 101, but is not limited thereto.

The connection electrode 104 for electrically connecting the driving element 110 and the organic light emitting diode 150 may be disposed on the first planarization layer 105a. Also, while not illustrated in FIG. 2, various metal layers that function as wiring lines or electrodes, such as a data line or a signal line, may also be disposed on the first planarization layer 105a.

Also, the second planarization layer 105b may be disposed on the first planarization layer 105a and the connection electrode 104. In the first exemplary embodiment of the present disclosure, the planarization layer 105 is composed of two layers because various signal lines increase in number as the resolution of the electroluminescent display device increases. Accordingly, it is difficult to dispose all the lines in a single layer so as to be spaced apart by a minimum distance from each other, and, thus, an additional layer is formed. The lines may be disposed with space to spare due to the additional layer (the second planarization layer 105b).

Therefore, it may be easier to design the layout of wiring lines or electrodes. Also, if a dielectric material is used for the planarization layer 105 having a multilayered structure, the planarization layer 105 may be used to form capacitance between metal layers. However, the present disclosure is not limited thereto.

The second planarization layer 105b may be formed to expose a part of the connection electrode 104. The drain electrode 112 of the driving element 110 and an anode 151 of the organic light emitting diode 150 may be electrically connected to each other by the connection electrode 104.

The organic light emitting diode 150 may have a structure in which the anode 151, a plurality of organic layers 152 and a cathode 153 are sequentially disposed. That is, the organic light emitting diode 150 may be composed of the anode 151 formed on the planarization layer 105, the organic layer 152 formed on the anode 151 and the cathode 153 formed on the organic layer 152.

The electroluminescent display device may be top emission type or a bottom emission type. For the top emission type, light emitted from the organic layer 152 may be reflected from the anode 151 toward an upper direction, (e.g., toward the cathode 153 there above). To this end, a reflective layer made of an opaque conductive material having high reflection efficiency such as silver (Ag), aluminum (Al), gold (Au), molybdenum (Mo), tungsten (W), chromium (Cr) or an alloy may be further disposed under the anode 151. In contrast, for the bottom emission type, the anode 151 may be made of a transparent conductive material such as indium tin oxide (ITO), indium zinc oxide (IZO), indium gallium zinc oxide (IGZO) or the like. Hereinafter, the electroluminescent display device of the present disclosure will be assumed as a bottom emission type electroluminescent display device.

A bank 106 may be formed on the planarization layer 105 except an emission area. That is, the bank 106 has a bank hole through which the anode 151 corresponding to the emission area is exposed. The bank 106 may be made of an inorganic insulating material, such as silicon nitride (SiNx) or silicon oxide (SiOx), or an organic insulating material, such as Benzocyclobutene (BCB), acryl-based resin or imide-based resin.

The bank 106 may extend to the non-display area NA.

The bank 106 may have a thickness of about 1 μm, but is not limited thereto.

The organic layer 152 may be disposed on the anode 151 exposed by the bank 106. The organic layer 152 may include an emission layer, an electron injection layer, an electron transport layer, a hole transport layer, a hole injection layer and the like.

The organic layer 152 may extend to the non-display area NA.

The organic layer 152 may be disposed on the bank 106 in the non-display area NA.

In the non-display area NA, the organic layer 152 may be disposed to be spaced apart by a predetermined distance from an end of the bank 106.

The cathode 153 may be disposed on the organic layer 152.

For the top emission type, the cathode 153 may contain a transparent conductive material. For example, the cathode 153 may be made of indium tin oxide (ITO), indium zinc oxide (IZO), indium gallium zinc oxide (IGZO) or the like. For the bottom emission type, the cathode 153 may contain any one of the group consisting of metal materials such as gold (Au), silver (Ag), aluminum (Al), molybdenum (Mo), magnesium (Mg), palladium (Pd) and copper (Cu) or an alloy thereof. Alternatively, the cathode 153 may have a laminated structure including a layer made of a transparent conductive material such as indium tin oxide (ITO), indium zinc oxide (IZO) or indium gallium zinc oxide (IGZO) and a layer made of metal materials such as gold (Au), silver (Ag), aluminum (Al), molybdenum (Mo), magnesium (Mg), palladium (Pd) and copper (Cu) or an alloy thereof. However, the present disclosure is not limited thereto.

The cathode 153 may extend to the non-display area NA.

In the non-display area NA, the cathode 153 may be disposed to cover a part of the organic layer 152. In this case, the cathode 153 may be disposed to be spaced apart by a predetermined distance from an end of the organic layer 152 in the non-display area NA. However, the present disclosure is not limited thereto. Since the cathode 153 is disposed to be spaced apart by a predetermined distance from the end of the organic layer 152, the reliable bezel L is increased compared to the prior art. Thus, a bezel width W may be reduced.

The capping layer 120 made of a material having high refractive index and light absorbance may be disposed on the organic light emitting diode 150 to reduce diffused reflection of external light.

The capping layer 120 may be an organic layer made of an organic material, and may be omitted if necessary.

The capping layer 120 may extend to the non-display area NA.

In the non-display area NA, the capping layer 120 may be disposed on the cathode 153. For example, the capping layer 120 and the cathode 153 may be disposed to be spaced apart by a predetermined distance from the end of the organic layer 152. However, the present disclosure is not limited thereto. FIG. 3 illustrates an example where one end of the cathode 153 and one end of the capping layer 120 match (in other words, are aligned with) each other. However, the present disclosure is not limited thereto.

The adhesive layer 130 and the encapsulation substrate 140 may be disposed on the capping layer 120.

The adhesive layer 130 and the encapsulation substrate 140 may be extended to the non-display area NA to cover a part of the planarization layer 105 and the bank 106. The adhesive layer 130 and the encapsulation substrate 140 may expose another part of the planarization layer 105. However, the present disclosure is not limited thereto.

The adhesive layer 130 may be disposed to cover the capping layer 120 and the pixel part 115. The adhesive layer 130 together with the capping layer 120 and the encapsulation substrate 140 may protect the organic light emitting diode 150 of the pixel part 115 against moisture, oxygen and impacts from the outside. The adhesive layer 130 may further contain a getter. The getter may be particles having hygroscopic properties and may absorb moisture and oxygen from the outside. Thus, it is possible to minimize permeation of moisture and oxygen into the pixel part 115.

The encapsulation substrate 140 may be disposed on the adhesive layer 130. The encapsulation substrate 140 and the adhesive layer 130 may protect the organic light emitting diode 150 of the pixel part 115. The encapsulation substrate 140 may protect the organic light emitting diode 150 against moisture, oxygen and impacts from the outside.

Meanwhile, as described above, the electroluminescent display device needs a minimum bezel distance, (e.g., the reliable bezel L), to secure reliability such as moisture permeation resistance or the like.

The reliable bezel L may be defined as a distance from an end of the encapsulation substrate 140 to an end of the cathode 153 in one embodiment.

An outer area of the display area AA except the reliable bezel L in the non-display area NA may be referred to as a shadow area. The shadow area may be defined by a gap between a mask and the substrate 101 when the cathode 153 and the organic layer 152 are deposited.

In the first exemplary embodiment of the present disclosure, the trench 180 including the under-cut structure UC is formed in the shadow area.

FIG. 3 illustrates an example where each of the under-cut structure UC and the trench 180 is formed in a column. However, the present disclosure is not limited thereto. Each of the under-cut structure UC and the trench 180 may be formed in two or more columns. The present disclosure is not limited by the number of columns of under-cut structures UC and trenches 180.

In this case, for example, the trench 180 may be formed by removing the capping layer 120, the cathode 153, the organic layer 152, the bank 106 and the planarization layer 105 in the shadow area outside the display area AA.

Within the trench 180, the under-cut structure UC composed of a bank pattern 106', an anode pattern 151' and a first planarization layer pattern 105a' made of the same materials as the bank 106, the anode 151 and the first planarization layer 105a, respectively, may be disposed.

The anode pattern 151' may be formed on the first planarization layer pattern 105a' simultaneously when the anode 151 is formed on the pixel part 115 of the display area AA. The anode pattern 151' may serve to enhance an adhesive force between the bank pattern 106' and the first planarization layer pattern 105a'. The bank pattern 106' may be disposed on the anode pattern 151' so as to cover the anode pattern 151'. However, the present disclosure is not limited thereto.

An organic layer pattern 152', a cathode pattern 153' and a capping layer pattern 120' respectively separated (disconnected) from the organic layer 152, the cathode 153 and the capping layer 120 on the left and right sides of the trench 180 may be disposed on the under-cut structure UC.

Side surfaces of the bank 106 and the planarization layer 105 may be exposed to left and right side walls of the trench 180. The organic layer 152, the cathode 153 and the capping layer 120 may be disposed to cover the exposed side surfaces of the bank 106 and the planarization layer 105. Meanwhile, the cathode 153 may be disposed to cover a side surface of the organic layer 152 within the trench 180.

Here, as for the under-cut structure UC, the porous first planarization layer pattern 105a' may be etched and may retreat inwards from an end of the bank pattern 106' to form an eave structure (e.g., an under-cut). Accordingly, the organic layer pattern 152', the cathode pattern 153' and the capping layer pattern 120' on the under-cut structure UC may be respectively separated (disconnected) from the organic layer 152, the cathode 153 and the capping layer 120 on the left and right sides of the trench 180.

The inside of the trench 180 except the under-cut structure UC may be filled with the adhesive layer 130. However, the present disclosure is not limited thereto. The inside of the trench 180 may be filled with any material which may suppress moisture permeation. For example, an inorganic layer made of an inorganic insulating material may be further disposed on the capping layer 120 including the inside of the trench 180. The inorganic layer may be made of silicon oxide (SiOx) or silicon nitride (SiNx), or may be formed as a multilayer thereof. In this case, the moisture permeation delay effect may be increased, and, thus, the reliable bezel may be further increased.

As described above, according to the first exemplary embodiment of the present disclosure, the trench 180 including the under-cut structure UC is formed in the unnecessary shadow area. Thus, it is possible to suppress or at least reduce moisture permeation through a lateral surface. Therefore, the bezel width W may be reduced by converting the shadow area into the reliable bezel L. This will be described in detail with reference to Comparative Embodiment.

Figure 4:
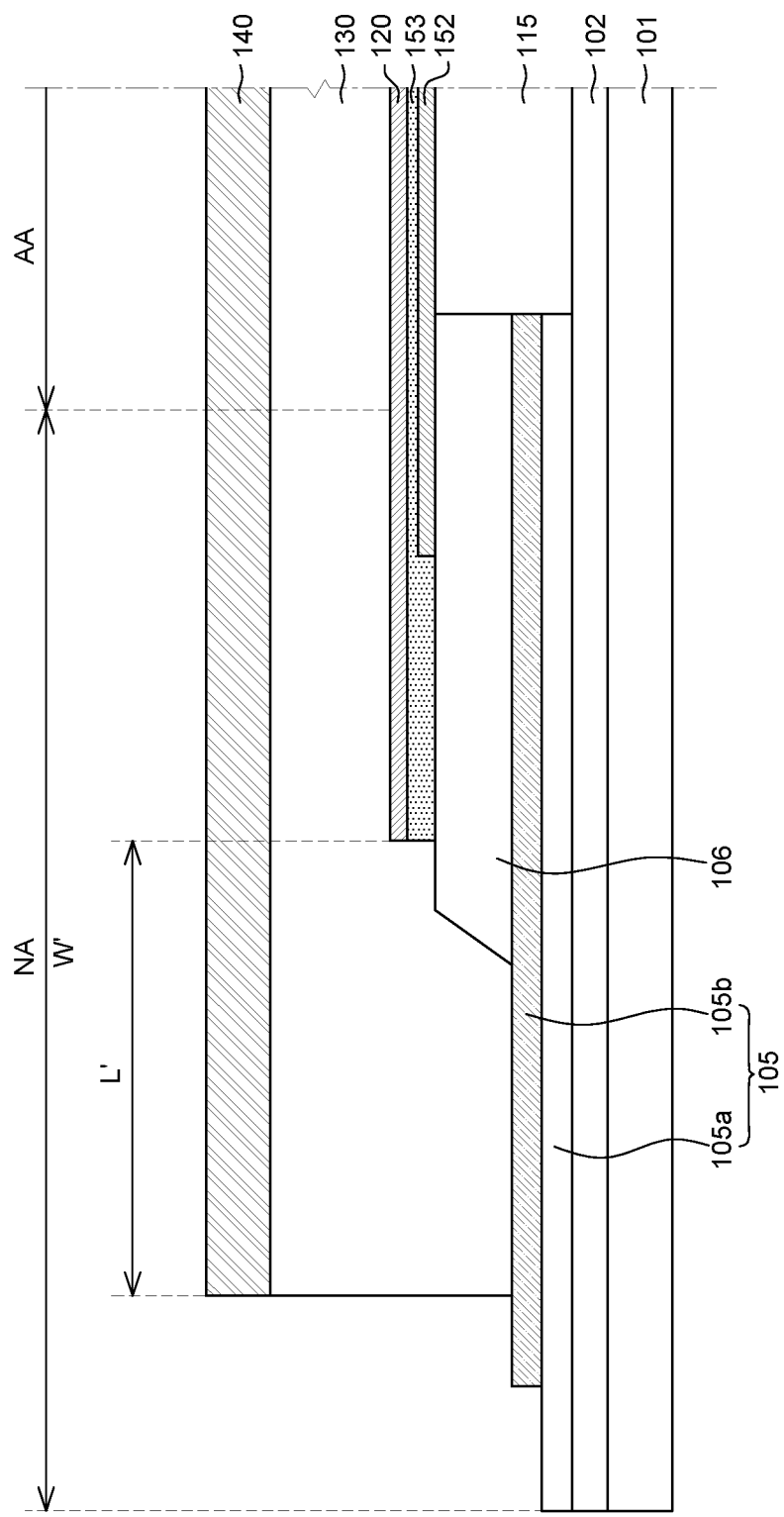
FIG. 4 is a cross-sectional view illustrating a part of an electroluminescent display device according to Comparative Embodiment.

FIG. 4 is a cross-sectional view illustrating a part of an electroluminescent display device according to Comparative Embodiment.

The electroluminescent display device according to Comparative Embodiment shown in FIG. 4 is substantially the same as the electroluminescent display device according to the first exemplary embodiment of the present disclosure shown in FIG. 3 except that the cathode 153 is formed to completely cover the organic layer 152 due to the absence of the under-cut structure and the trench.

Referring to FIG. 4, the electroluminescent display device according to Comparative Embodiment does not include the under-cut structure and the trench according to the first exemplary embodiment of the present disclosure. Therefore, in the electroluminescent display device according to Comparative Embodiment unlike the electroluminescent display device according to the first exemplary embodiment of the present disclosure, the cathode 153 needs to be formed to completely cover the organic layer 152. Accordingly, it may be seen that a reliable bezel L' may not be sufficiently secured. As a result, it may be seen that a bezel width W' is increased compared to the electroluminescent display device according to the first exemplary embodiment of the present disclosure shown in FIG. 3.

FIG. 5A through FIG. 5E are cross-sectional views sequentially illustrating a part of a manufacturing process of the electroluminescent display device shown in FIG. 3 according to the first exemplary embodiment of the present disclosure.

FIG. 6A through FIG. 6G are cross-sectional views more specifically illustrating a part of a manufacturing process of a non-display area in the electroluminescent display device shown in FIG. 3 according to the first exemplary embodiment of the present disclosure.

A manufacturing process of a part of the non-display area NA is shown on the left sides in FIG. 5A through FIG. 5E as an example. Also, a manufacturing process of a part of the display area AA is shown on the right sides in FIG. 5A through FIG. 5E as an example.

In FIG. 6A through FIG. 6G, for the convenience of description, the illustration of the substrate 101 under the buffer layer 102 is omitted.

Figure 5A:
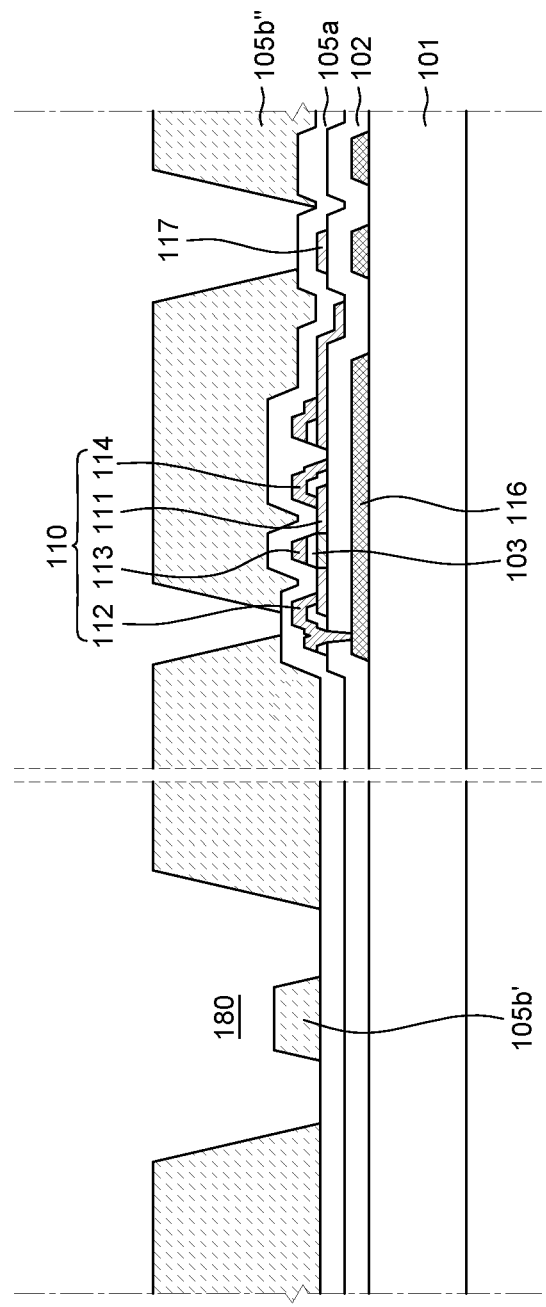
FIG. 5A through FIG. 5E are cross-sectional views sequentially illustrating a part of a manufacturing process of the electroluminescent display device shown in FIG. 3 according to the first exemplary embodiment of the present disclosure.
Figure 6A:
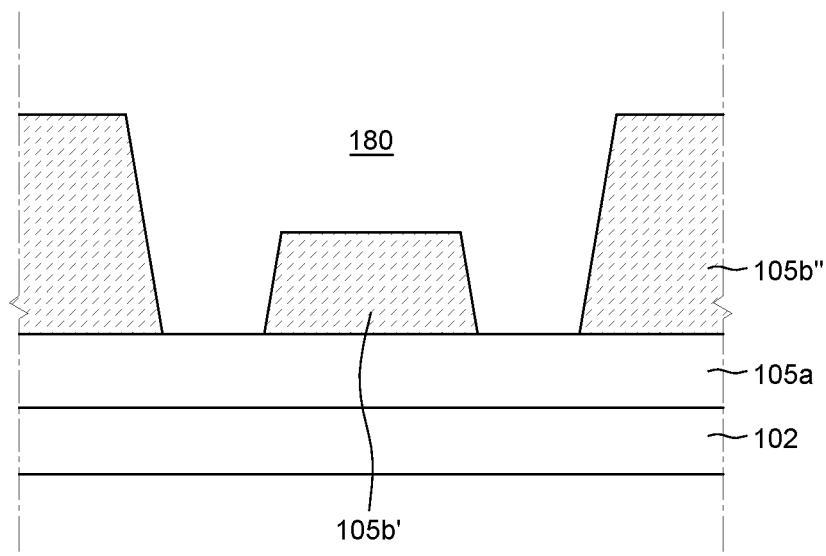
FIG. 6A through FIG. 6G are cross-sectional views more specifically illustrating a part of a manufacturing process of a non-display area in the electroluminescent display device shown in FIG. 3 according to the first exemplary embodiment of the present disclosure.

Referring to FIG. 5A and FIG. 6A, various components of a pixel part are formed on the substrate 101.

As described above, the pixel part is formed on a display area of the substrate 101 and may include various components under an organic layer.

That is, for example, the buffer layer 102 may be formed on the substrate 101.

The buffer layer 102 is a functional layer configured to protect various electrodes and lines against impurities such as alkali ions flowing out from the substrate 101 or its lower layers. The buffer layer 102 may have a multilayered structure including a first buffer layer and a second buffer layer, but is not limited thereto. The buffer layer 102 may be made of silicon oxide (SiOx) or silicon nitride (SiNx), or may be formed as a multilayer thereof.

The light shielding layer 116 may be disposed between the substrate 101 and the buffer layer 102.

The light shielding layer 116 may be disposed on the substrate 101 at a position where the active layer 111 is to be formed. The light shielding layer 116 may also be formed under a second storage electrode 117, but is not limited thereto. The light shielding layer 116 disposed under the second storage electrode 117 may also be referred to as a first storage electrode.

The buffer layer 102 may be disposed on the entire surface of the substrate 101 on which the light shielding layer 116 has been formed. That is, the buffer layer 102 may be formed extending to a non-display area.

The driving element 110 may be formed on the buffer layer 102.

The active layer 111 may be formed on the buffer layer 102. The active layer 111 may be made of polycrystalline silicon (p-Si) and in this case, a predetermined area may be doped with impurities. Alternatively, the active layer 111 may be made of amorphous silicon (a-Si), or may be made of various organic semiconductor materials such as pentacene.

The active layer 111 may also be made of oxide.

Further, the second storage electrode 117 may be formed on the buffer layer 102, but is not limited thereto.

The interlayer insulating layer 103 may be formed on the active layer 111.

The interlayer insulating layer 103 may be made of an insulating inorganic material such as silicon oxide (SiOx) or silicon nitride (SiNx), and may also be made of an insulating organic material, and the like.

The gate electrode 113 may be formed on the interlayer insulating layer 103. Further, the source electrode 114 and the drain electrode 112 may be formed on the interlayer insulating layer 103. However, the present disclosure is not limited thereto. After the gate electrode 113 is formed, the source electrode 114 and the drain electrode 112 may also be formed on another layer different from the interlayer insulating layer 103.

The gate electrode 113, the source electrode 114 and the drain electrode 112 may be formed as a single layer or a multilayered structure. The gate electrode 113, the source electrode 114 and the drain electrode 112 may be made of various conductive materials such as magnesium (Mg), aluminum (Al), nickel (Ni), chromium (Cr), molybdenum (Mo), tungsten (W), gold (Au) or an alloy thereof.

A passivation layer made of an inorganic insulating material may be further formed to cover the gate electrode 113, the source electrode 114 and the drain electrode 112.

The first planarization layer 105a may be disposed on the driving element 110 configured as described above.

The first planarization layer 105a may be extended to the non-display area.

Meanwhile, for the bottom emission type, a predetermined color filter layer may be formed on the first planarization layer 105a in the display area. However, the present disclosure is not limited thereto.

Then, an insulating layer 105b" may be formed on the first planarization layer 105a.

The insulating layer 105b" may include an overcoat layer, but is not limited thereto.

The insulating layer 105b" may have a first thickness.

Meanwhile, as for the insulating layer 105b" in the display area, an upper part of the drain electrode 112 and an upper part of the second storage electrode 117 may be removed.

Also, as for the insulating layer 105b" in the non-display area, a part of the shadow area may be removed to form the trench 180. In this case, an insulating layer pattern 105b' formed of an insulating layer may be formed within the trench 180.

The insulating layer 105b" in the non-display area may be formed to be spaced apart by a predetermined distance from an end of the substrate 101, but is not limited thereto.

The insulating layer pattern 105b' may have a second thickness smaller than the first thickness.

The insulating layer 105b" and the insulating layer pattern 105b' may be formed by the same mask process. For example, the insulating layer 105b" and the insulating layer pattern 105b' may be formed by coating an organic insulating material on the substrate 101 and then performing a single mask process using a half-tone mask. However, the present disclosure is not limited thereto. For example, the insulating layer 105b" may be formed by using the full tone of the half-tone mask, and the insulating layer pattern 105b' may be formed by using the half tone of the half-tone mask. However, the present disclosure is not limited thereto.

Figure 5B:
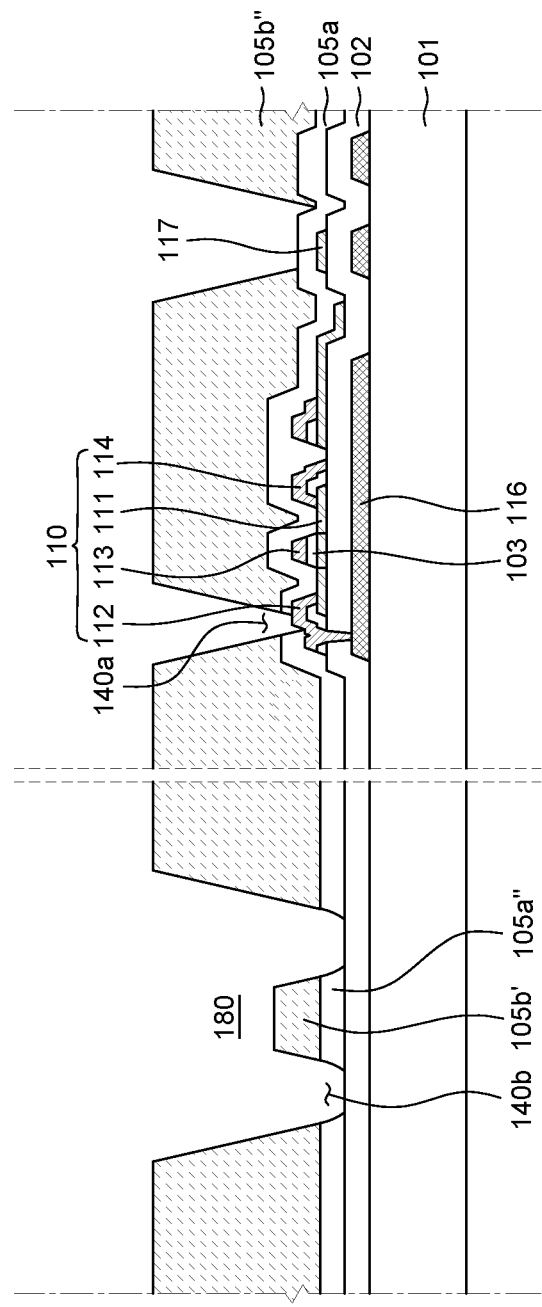
Figure 6B:
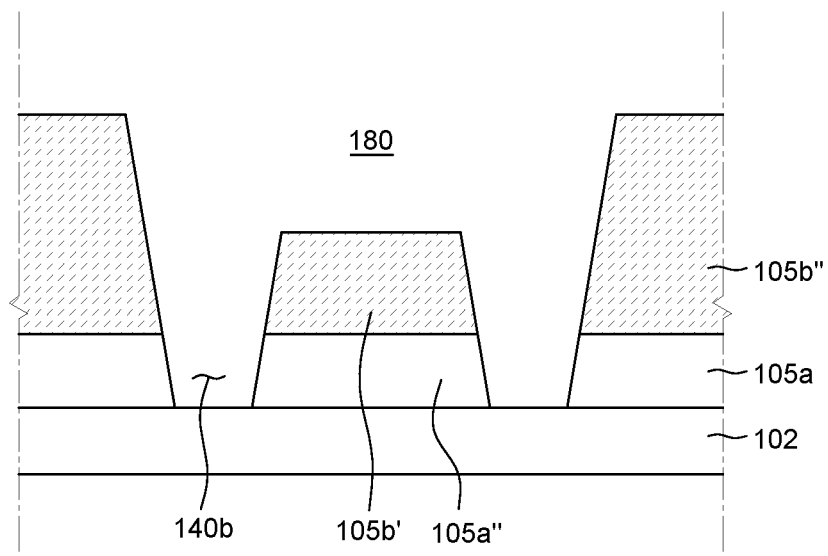

Then, referring to FIG. 5B and FIG. 6B, a first contact hole 140a through which a part of the drain electrode 112 is exposed in the display area may be formed by selectively removing the first planarization layer 105a using the insulating layer 105b" and the insulating layer pattern 105b' as a mask. The first planarization layer 105a is disposed under the insulating layer 105b" and the insulating layer pattern 105b'. Also, a second contact hole 140b through which the buffer layer 102 on the left and right sides of the insulating layer pattern 105b' is exposed may be formed within the trench 180.

In this case, a first planarization layer pre-pattern 105a" formed of the first planarization layer 105a may be formed under the insulating layer pattern 105b'.

Wet etching may be used to remove the first planarization layer 105a. However, the present disclosure is not limited thereto.

Figure 5C:
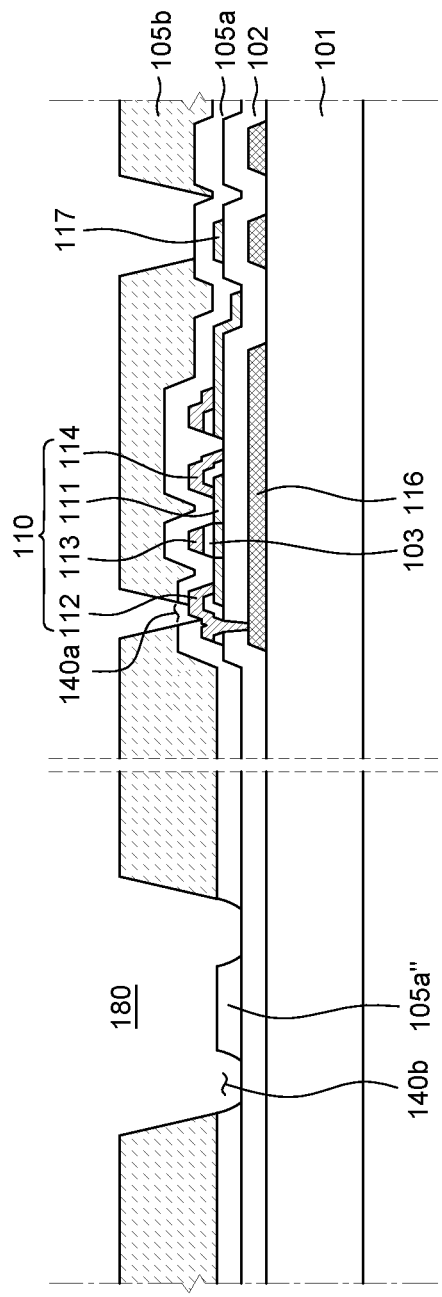
Figure 6C:
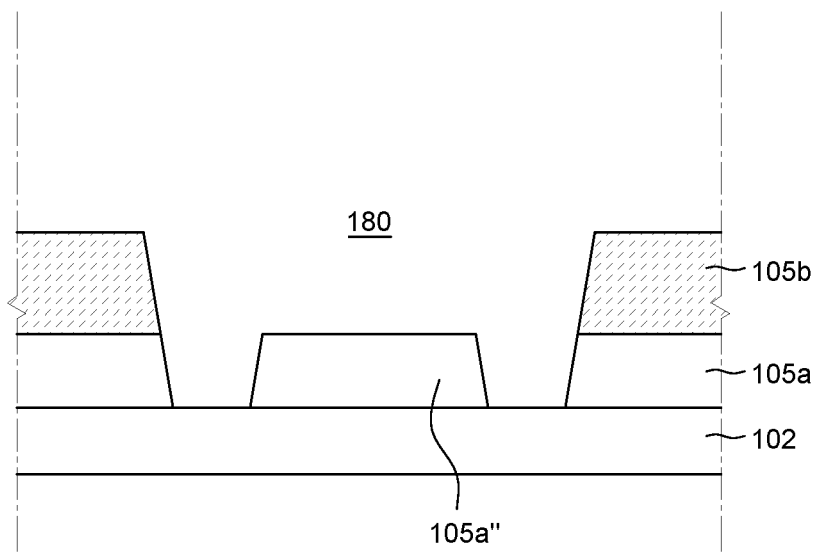

Thereafter, referring to FIG. 5C and FIG. 6C, the insulating layer pattern 105b' is removed by etching a part of the insulating layer 105b" and a part of the insulating layer pattern 105b' in a thickness direction.

At the same time, a part of the insulating layer 105b" may be removed in a thickness direction. Thus, the second planarization layer 105b having a third thickness smaller than the first thickness may be formed.

Figure 5D:
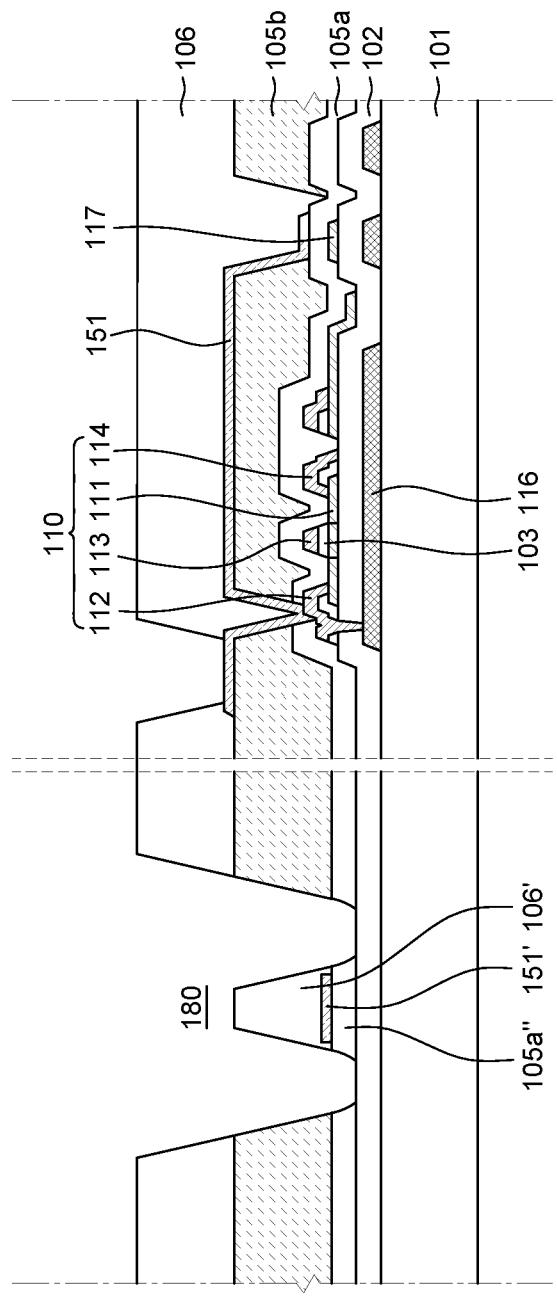
Figure 6D:
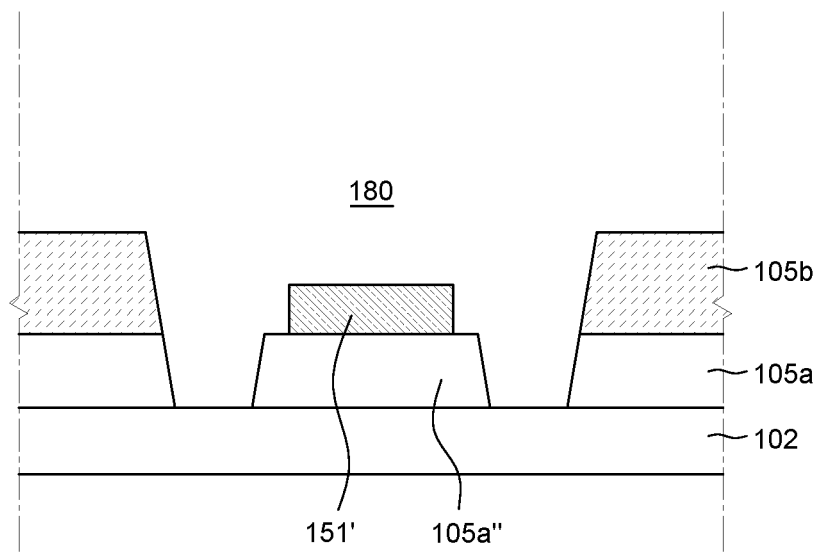
Figure 6E:
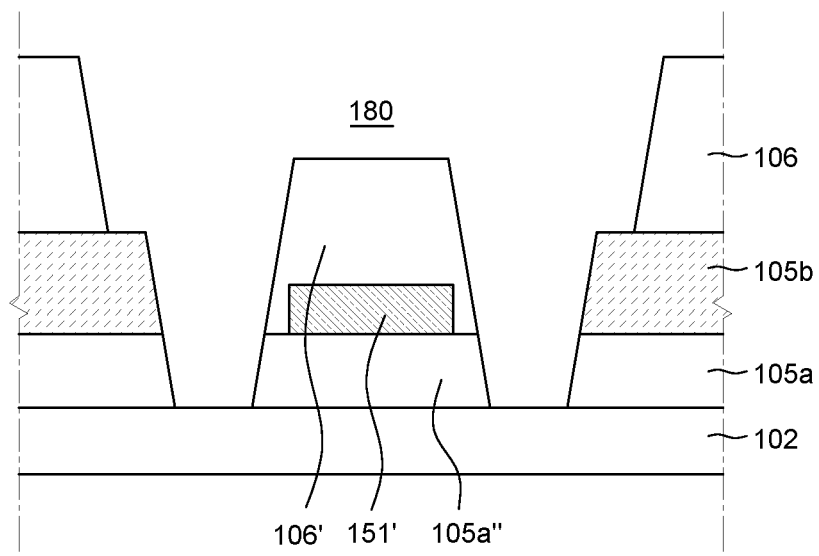

Then, referring to FIG. 5D, FIG. 6D and FIG. 6E, the anode 151 may be formed on the second planarization layer 105b in the display area by using a predetermined conductive material. Also, the anode pattern 151' may be formed on the first planarization layer pre-pattern 105a" within the trench 180.

For example, the anode 151 and the anode pattern 151' may be formed by deposition of a conductive material, a mask process, wet etching and a strip process, but are not limited thereto.

As described above, the electroluminescent display device may be top emission type or a bottom emission type. For the top emission type, a reflective layer made of an opaque conductive material having high reflection efficiency such as silver (Ag), aluminum (Al), gold (Au), molybdenum (Mo), tungsten (W), chromium (Cr) or an alloy may be further disposed under the anode 151 and the anode pattern 151'.

Meanwhile, for the bottom emission type, the anode 151 and the anode pattern 151' may be made of a transparent conductive material such as indium tin oxide (ITO), indium zinc oxide (IZO), indium gallium zinc oxide (IGZO) or the like.

The anode pattern 151' may be patterned to have a smaller width than the first planarization layer pre-pattern 105a''.

Then, the bank 106 may be formed on the second planarization layer 105b except an emission area by coating a predetermined insulating material. That is, the bank 106 may have a bank hole through which the anode 151 corresponding to the emission area is exposed. The bank 106 may be made of an inorganic insulating material, such as silicon nitride (SiNx) or silicon oxide (SiOx), or an organic insulating material, such as BCB, acryl-based resin or imide-based resin.

The bank 106 may extend to the non-display area NA.

Further, the bank pattern 106' made of an insulating material used to form the bank 106 may be formed on the first planarization layer pre-pattern 105a'' and the anode pattern 151'.

The anode pattern 151' may serve to enhance an adhesive force between the first planarization layer pre-pattern 105a'' and the bank pattern 106'. The bank pattern 106' may be formed on the anode pattern 151' so as to cover the anode pattern 151'. However, the present disclosure is not limited thereto.

Figure 5E:
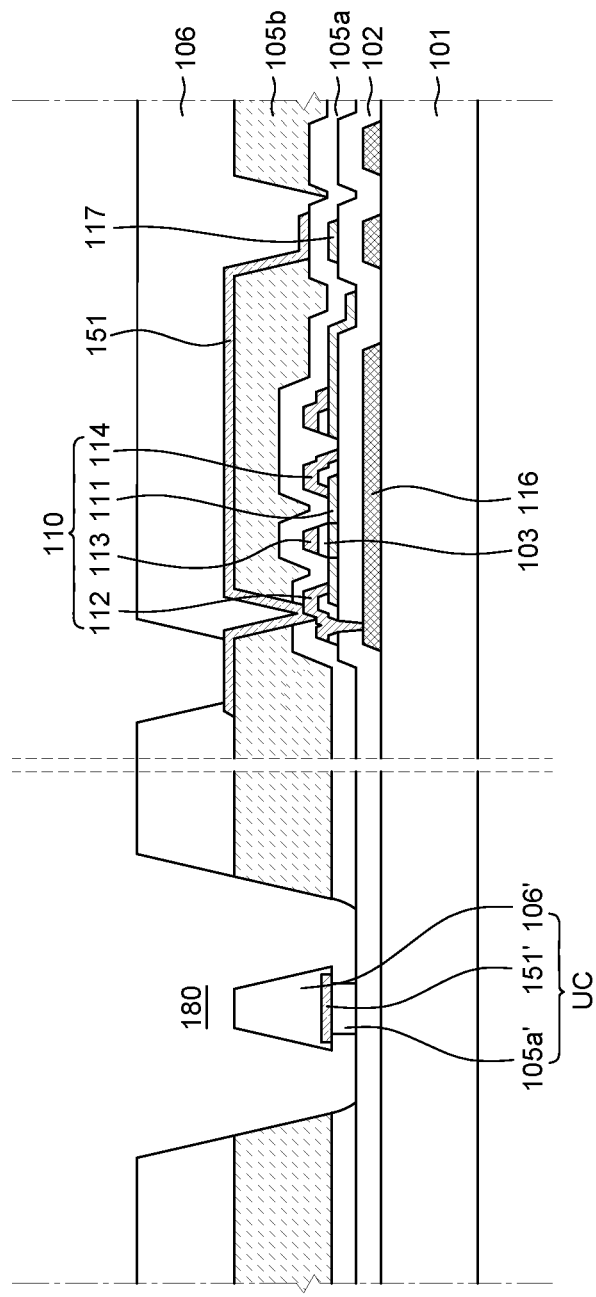
Figure 6F:
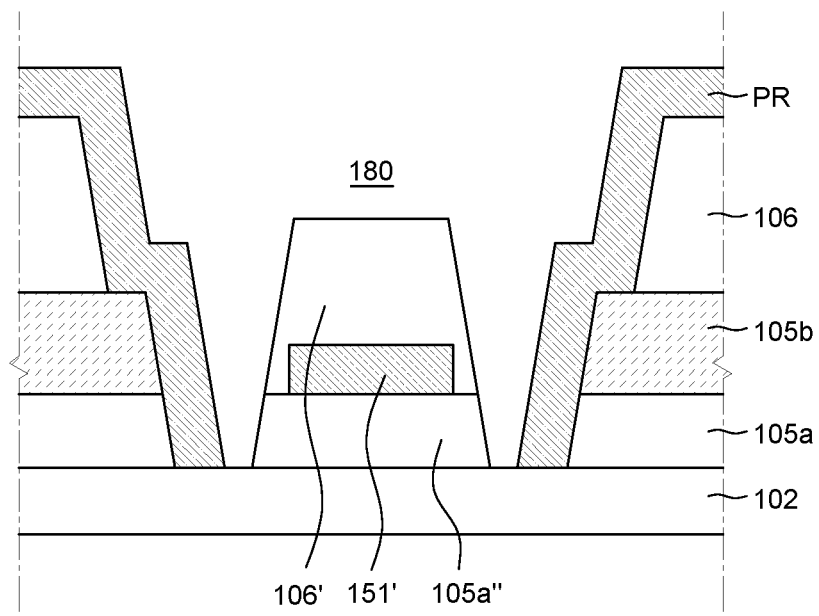
Figure 6G:
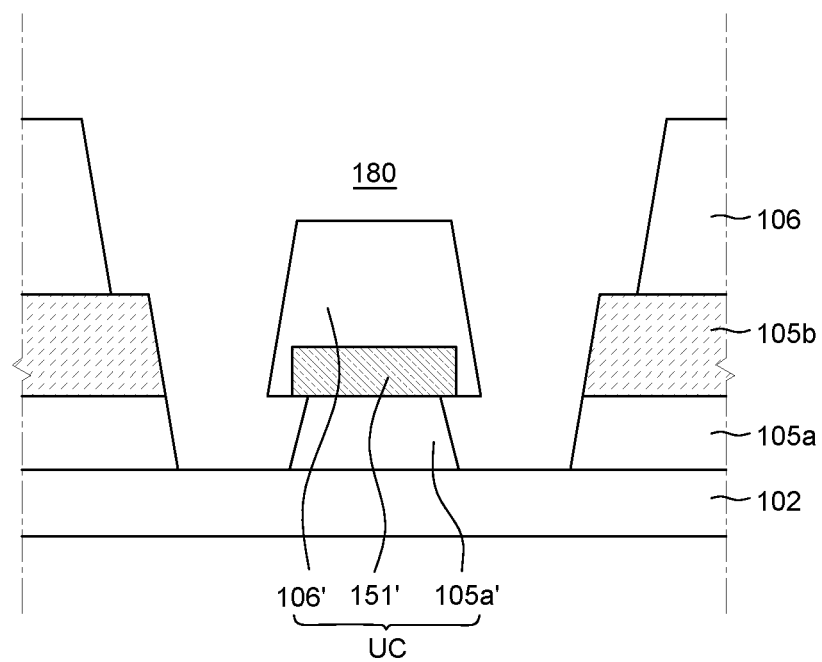

Thereafter, referring to FIG. 5E, FIG. 6F, and FIG. 6G, a photosensitive film pattern PR may be formed on the bank 106 so as to cover the bank 106 in order to form an under-cut structure. For example, the photosensitive film pattern PR may be formed to cover not only an upper surface and a lateral surface of the bank 106, but also lateral surfaces of the first and second planarization layers 105a and 105b under the bank 106.

Meanwhile, since the photosensitive film pattern PR is not formed on an upper surface and a lateral surface of the bank pattern 106', the bank pattern 106' may be exposed. In this case, a lateral surface of the first planarization layer pre-pattern 105a'' under the bank pattern 106' may also be exposed.

Then, the first planarization layer pre-pattern 105a'' under the bank pattern 106' may be wet-etched using the photosensitive film pattern PR as a mask to form the under-cut structure UC within the trench 180.

That is, the porous first planarization layer pre-pattern 105a'' is etched to form the first planarization layer pattern 105a' having a smaller width. In this case, the first planarization layer pattern 105a' may retreat inwards from an end of the bank pattern 106' to form an eave structure (e.g., the under-cut structure UC).

Within the trench 180, the under-cut structure UC composed of the bank pattern 106', the anode pattern 151' and the first planarization layer pattern 105a' made of the same materials as the bank 106, the anode 151 and the first planarization layer 105a, respectively, may be formed.

Thereafter, the photosensitive film pattern PR may be removed by stripping.

Then, although not shown in the drawings, an organic layer, a cathode and a capping layer may be sequentially formed on the substrate 101 on which the under-cut structure UC has been formed.

The organic layer may include an emission layer, an electron injection layer, an electron transport layer, a hole transport layer, a hole injection layer and the like. However, the present disclosure is not limited thereto.

The organic layer may extend to the non-display area.

The organic layer may be formed on the bank 106 in the non-display area.

The cathode may be formed on the organic layer.

The cathode may extend to the non-display area.

In the non-display area, the cathode may be disposed to cover a part of the organic layer. That is, in the non-display area, the cathode may be disposed to be spaced apart by a predetermined distance from an end of the organic layer. However, the present disclosure is not limited thereto. Since the cathode is disposed to be spaced apart by a predetermined distance from the end of the organic layer, the reliable bezel is increased compared to the prior art. Thus, a bezel width may be reduced.

The capping layer made of a material having high refractive index and light absorbance may be formed on the cathode to reduce diffused reflection of external light.

The capping layer may be an organic layer made of an organic material, and may be omitted if necessary.

The capping layer may extend to the non-display area.

Meanwhile, an organic layer pattern, a cathode pattern and a capping layer pattern made of the same materials as the organic layer, the cathode and the capping layer, respectively, may be sequentially formed on the under-cut structure UC.

In this case, the organic layer pattern, the cathode pattern and the capping layer pattern on the under-cut structure may be respectively separated (disconnected) from the organic layer, the cathode and the capping layer on the left and right sides of the trench 180.

When the under-cut structure UC is applied, the second planarization layer 105b, the bank 106 and the organic layer may be separated (disconnected) between the non-display area and the display area by the under-cut structure UC. Thus, it is possible to suppress or at least reduce moisture permeation through a lateral surface.

Also, the cathode may retreat toward the display area, and, thus, the reliable bezel may be further secured.

Then, an adhesive layer and an encapsulation substrate may be sequentially formed on the substrate 101 on which the capping layer has been formed.

The adhesive layer together with the capping layer and the encapsulation substrate may protect an organic light emitting diode of a pixel part against moisture, oxygen and impacts from the outside. The adhesive layer may further contain a getter.

The inside of the trench 180 except the under-cut structure UC may be filled with the adhesive layer. However, the present disclosure is not limited thereto. The inside of the trench 180 may be filled with any material which may suppress moisture permeation. For example, an inorganic layer made of an inorganic insulating material may be further disposed on the capping layer including the inside of the trench 180. The inorganic layer may be made of silicon oxide (SiOx) or silicon nitride (SiNx), or may be formed as a multilayer thereof. In this case, the moisture permeation delay effect may be increased, and, thus, the reliable bezel may be further increased. This will be described in detail with reference to a second exemplary embodiment of the present disclosure.

Figure 7:
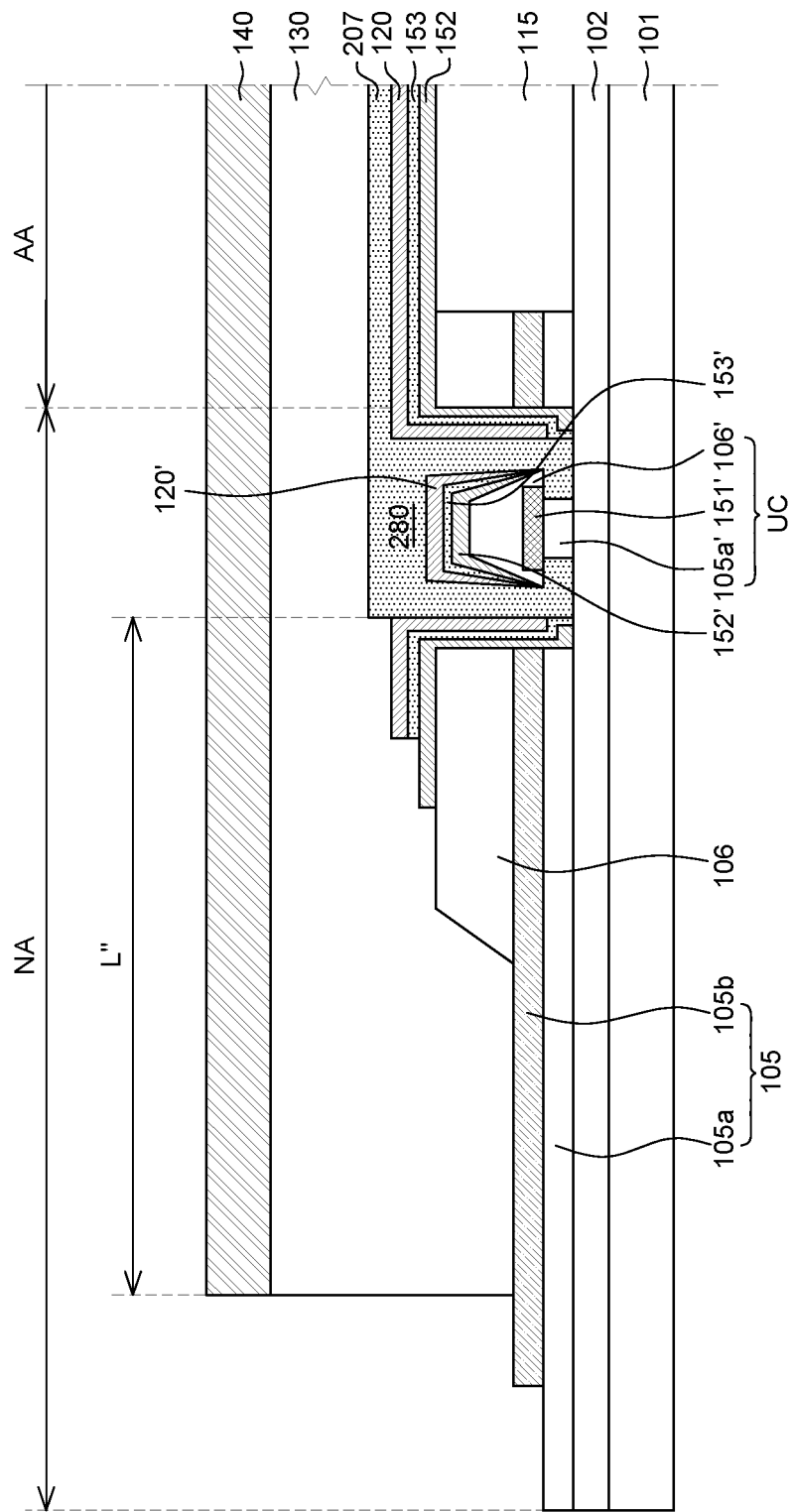
FIG. 7 is a cross-sectional view illustrating an electroluminescent display device according to a second exemplary embodiment of the present disclosure.

FIG. 7 is a cross-sectional view illustrating an electroluminescent display device according to the second exemplary embodiment of the present disclosure.

The second exemplary embodiment of the present disclosure shown in FIG. 7 is substantially the same as the electroluminescent display device according to the first exemplary embodiment of the present disclosure shown in FIG. 3 except that an inorganic layer 207 made of an inorganic insulating material is further formed on the capping layer 120. Therefore, a redundant description thereof will be omitted. The same components will be denoted by the same reference numerals, respectively.

Referring to FIG. 7, in the electroluminescent display device according to the second exemplary embodiment of the present disclosure, a trench 280 including the under-cut structure UC is formed in the shadow area within the non-display area NA in the same manner as in the first exemplary embodiment of the present disclosure. Thus, it is possible to suppress or at least reduce moisture permeation through a lateral surface. Also, the end of the cathode 153 may retreat toward the display area AA and an inorganic layer 207 made of an inorganic insulating material is further formed within the trench 280. Therefore, a reliable bezel L" may be increased, and, thus, a bezel width may be reduced.

In the second exemplary embodiment of the present disclosure, the under-cut structure UC and the trench 280 may be formed on three sides of the non-display area NA except the lower side, (e.g., the data pad area), of the display panel connected to the flexible film. However, the present disclosure is not limited thereto. Also, on the upper side of the non-display area NA among the three sides of the non-display area NA, the under-cut structure UC and the trench 280 are formed as a single body. Meanwhile, on the left and right sides of the non-display area NA, the under-cut structure UC and the trench 280 may be divided into a plurality of ones. However, the present disclosure is not limited thereto.

For example, the trench 280 including the under-cut structure UC may be formed by patterning the bank 106 and the planarization layer 105 in the shadow area outside the display area AA by a photolithography process.

In the second exemplary embodiment of the present disclosure, the inorganic layer 207 made of an inorganic insulating material is further disposed on the capping layer 120 including the inside of the trench 280. In this case, the moisture permeation delay effect may be increased by the inorganic layer 207. Thus, the reliable bezel L" may be increased compared to the above-described first exemplary embodiment of the present disclosure. That is, in the above-described first exemplary embodiment of the present disclosure, the reliable bezel L is defined from the end of the encapsulation substrate 140 to the end of the cathode 153, but in the second exemplary embodiment of the present disclosure, the reliable bezel L" may be defined from an end of the encapsulation substrate 140 to a side surface of the inorganic layer 207 filled within the trench 280, and the reliable bezel L" may be further increased due to the inorganic layer 207. The inorganic layer 207 made of an inorganic insulating material capable of delaying moisture permeation is formed within the trench 280.

The inorganic layer 207 may be made of silicon oxide (SiOx) or silicon nitride (SiNx), or may be formed as a multilayer thereof.

FIG. 7 illustrates an example where the inorganic layer 207 is disposed on the capping layer 120 in the display area AA including the inside of the trench 280, but is not disposed on the capping layer 120 in the non-display area NA. However, the present disclosure is not limited thereto. The inorganic layer 207 according to the second exemplary embodiment of the present disclosure may be disposed on the capping layer 120 in the display area AA and the non-display area NA including the inside of the trench 280. Also, the inorganic layer 207 according to the second exemplary embodiment of the present disclosure may extend to cover an upper surface of the capping layer 120 in the display area AA and the non-display area NA including the inside of the trench 280 and a lateral surface of the bank 106 in the non-display area NA.

Meanwhile, in the first and second exemplary embodiments of the present disclosure, there is described an example where a gate line passes through on the left and right sides of the non-display area among the three sides of the non-display area, and, thus, the under-cut structure and the trench are divided into a plurality of ones by the gate line. However, the present disclosure is not limited thereto. According to the present disclosure, if a gate line has a bypass structure, the under-cut structure and the trench may be formed as a single body (e.g., integrated with each other) on the three sides of the non-display area except the lower side. This will be described in detail with reference to a third exemplary embodiment of the present disclosure.

Figure 8:
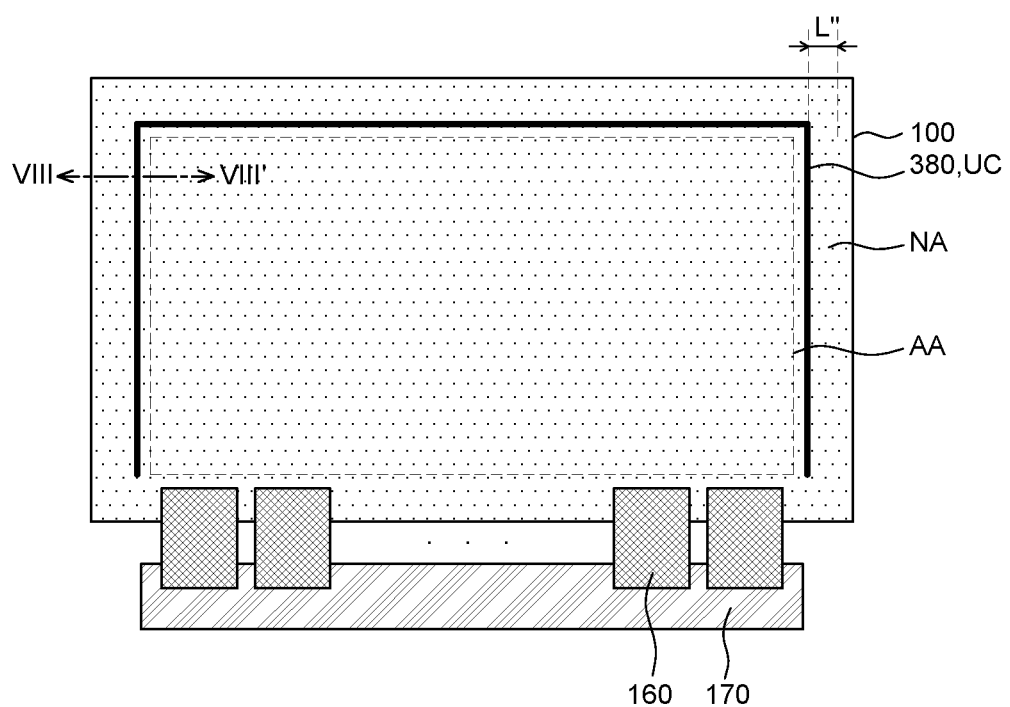
FIG. 8 is a plan view illustrating an electroluminescent display device according to a third exemplary embodiment of the present disclosure.

FIG. 8 is a plan view illustrating an electroluminescent display device according to a third exemplary embodiment of the present disclosure.

Figure 9A:
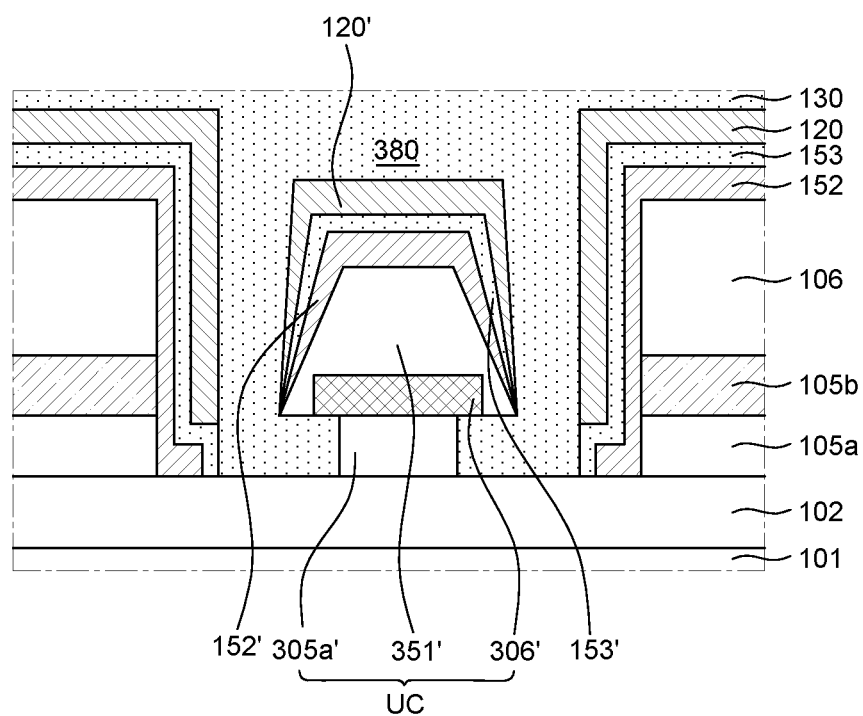
FIG. 9A and FIG. 9B are cross-sectional views as taken along a line VIII-VIII' of FIG. 8 according to the third exemplary embodiment of the present disclosure.
Figure 9B:
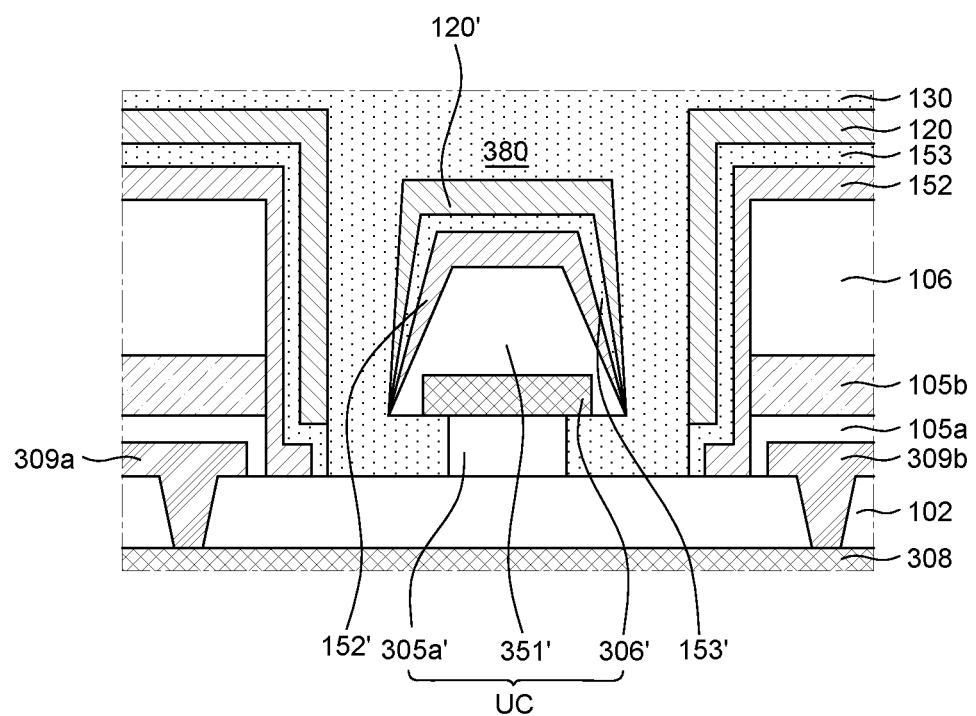

FIG. 9A and FIG. 9B are cross-sectional views as taken along a line of FIG. 8 according to the third exemplary embodiment of the present disclosure.

The third exemplary embodiment of the present disclosure shown in FIG. 8, FIG. 9A and FIG. 9B is substantially the same as the electroluminescent display device according to the first exemplary embodiment of the present disclosure shown in FIG. 1 through FIG. 3 except that gate lines 309a and 309b have a bypass structure and the under-cut structure UC and a trench 380 are formed as a single body (e.g., integrated with each other) on the three sides of the non-display area NA except the lower side. Therefore, a redundant description thereof will be omitted. The same components will be denoted by the same reference numerals, respectively.

Further, FIG. 9A illustrates a cross-sectional view of a part of the non-display area NA where the gate lines 309a and 309b do not pass through as an example. FIG. 9B illustrates a cross-sectional view of a part of the non-display area NA where the gate lines 309a and 309b pass through as an example.

Referring to FIG. 8, FIG. 9A and FIG. 9B, the electroluminescent display device according to the third exemplary embodiment of the present disclosure may include the display panel 100, the flexible film 160 and the printed circuit board 170.

In the third exemplary embodiment of the present disclosure, the trench 380 including the under-cut structure UC composed of a bank pattern 351', an anode pattern 306' and a first planarization layer pattern 305a' is formed in the shadow area within the non-display area NA in the same manner as in the first and second exemplary embodiments. Thus, it is possible to suppress or at least reduce moisture permeation through a lateral surface. Also, since the moisture permeation through the lateral surface may be suppressed, the end of the cathode 153 may retreat toward the display area AA. Therefore, a reliable bezel may be increased, and, thus, a bezel width may be reduced.

Further, in the third exemplary embodiment of the present disclosure, the gate lines 309a and 309b have a bypass structure. Therefore, the under-cut structure UC and the trench 380 are formed as a single body (e.g., integrated with each other) on the three sides of the non-display area NA except the lower side of the display panel 100. Accordingly, it is possible to more effectively block a lateral moisture permeation route and thus possible to improve reliability.

In particular, referring to FIG. 9B, a connection line 308 is disposed under the buffer layer 102, and the left and right gate lines 309a and 309b divided by the trench 380 may be electrically connected to each other by the connection line 308.

Meanwhile, side surfaces of the bank 106 and the first and second planarization layers 105a and 105b may be exposed to left and right side walls of the trench 380. The organic layer 152, the cathode 153 and the capping layer 120 may be disposed to cover the exposed side surfaces of the bank 106 and the first and second planarization layers 105a and 105b. The cathode 153 may be disposed to cover a side surface of the organic layer 152 within the trench 380.

FIG. 8 illustrates an example where each of the under-cut structure UC and the trench 380 is formed in a column. However, the present disclosure is not limited thereto. Each of the under-cut structure UC and the trench 380 may be formed in two or more columns. The present disclosure is not limited by the number of columns of under-cut structures UC and trenches 380.

FIG. 10A through FIG. 10D are cross-sectional views sequentially illustrating a part of a manufacturing process of the electroluminescent display device according to the third exemplary embodiment of the present disclosure.

FIG. 11A through FIG. 11D are other cross-sectional views sequentially illustrating a part of the manufacturing process of the electroluminescent display device according to the third exemplary embodiment of the present disclosure.

FIG. 10A through FIG. 10D sequentially illustrate a part of a manufacturing process of a display panel including an area where the gate lines 309a and 309b do not pass through. FIG. 11A through FIG. 11D sequentially illustrate a part of a manufacturing process of a display panel including an area where the gate lines 309a and 309b pass through.

A manufacturing process of a part of the non-display area NA is shown on the left sides in FIG. 10A through FIG. 10D and FIG. 11A through FIG. 11D. Also, a manufacturing process of a part of the display area AA is shown on the right sides in FIG. 10A through FIG. 10D and FIG. 11A through FIG. 11D.

Figure 10A:
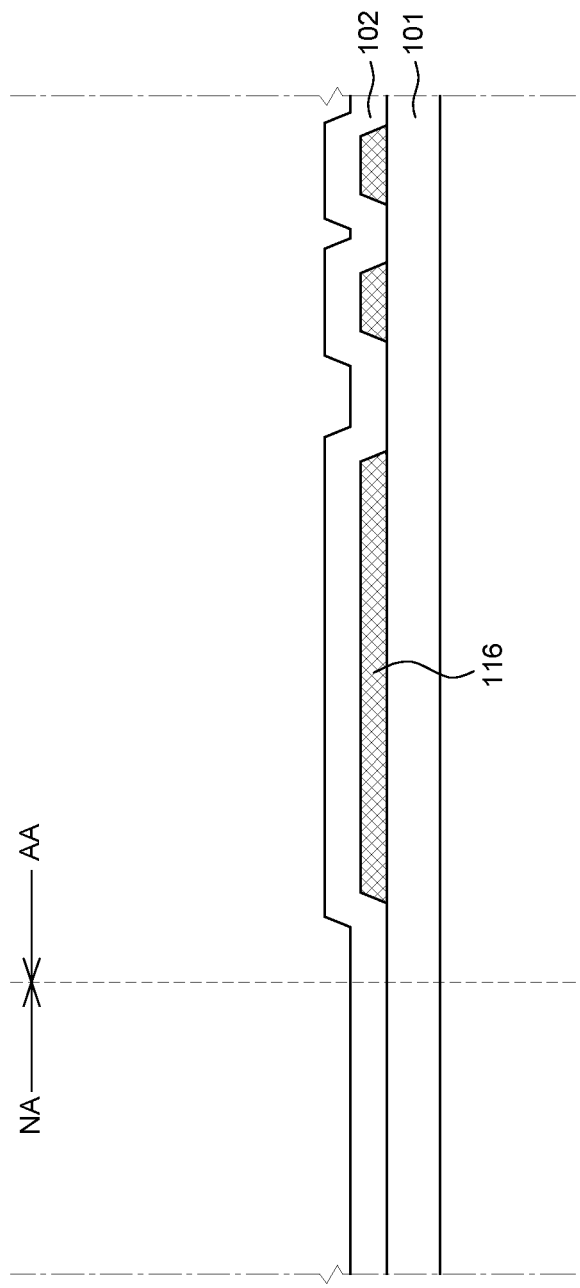
FIG. 10A through FIG. 10D are cross-sectional views sequentially illustrating a part of a manufacturing process of the electroluminescent display device according to the third exemplary embodiment of the present disclosure.
Figure 11A:
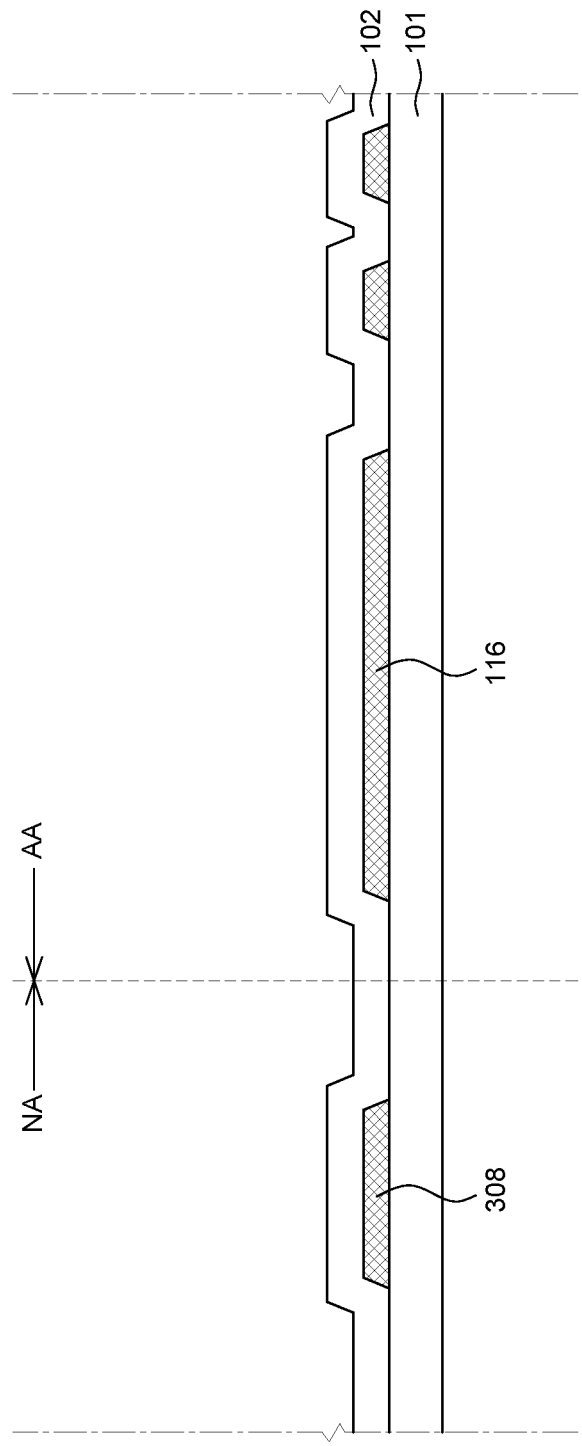
FIG. 11A through FIG. 11D are other cross-sectional views sequentially illustrating a part of the manufacturing process of the electroluminescent display device according to the third exemplary embodiment of the present disclosure.

Referring to FIG. 10A and FIG. 11A, the light shielding layer 116 may be formed on the substrate 101.

The light shielding layer 116 may be formed under the active layer on the substrate 101 in the display area AA. The light shielding layer 116 may also be formed under a second storage electrode on the substrate 101 in the display area AA, but is not limited thereto. The light shielding layer 116 disposed under the second storage electrode may also be referred to as a first storage electrode.

Further, the connection line 308 may be formed under the trench on the substrate in the non-display area NA.

The light shielding layer 116 and the connection line 308 may be made of an opaque conductive material by the same mask process.

The buffer layer 102 may be formed on the substrate 101 on which the light shielding layer 116 and the connection line 308 have been formed.

The buffer layer 102 is a functional layer configured to protect various electrodes and lines against impurities such as alkali ions flowing out from the substrate 101 or its lower layers. The buffer layer 102 may have a multilayered structure including a first buffer layer and a second buffer layer, but is not limited thereto. The buffer layer 102 may be made of silicon oxide (SiOx) or silicon nitride (SiNx), or may be formed as a multilayer thereof.

The buffer layer 102 may be extended to the non-display area NA.

Figure 10B:
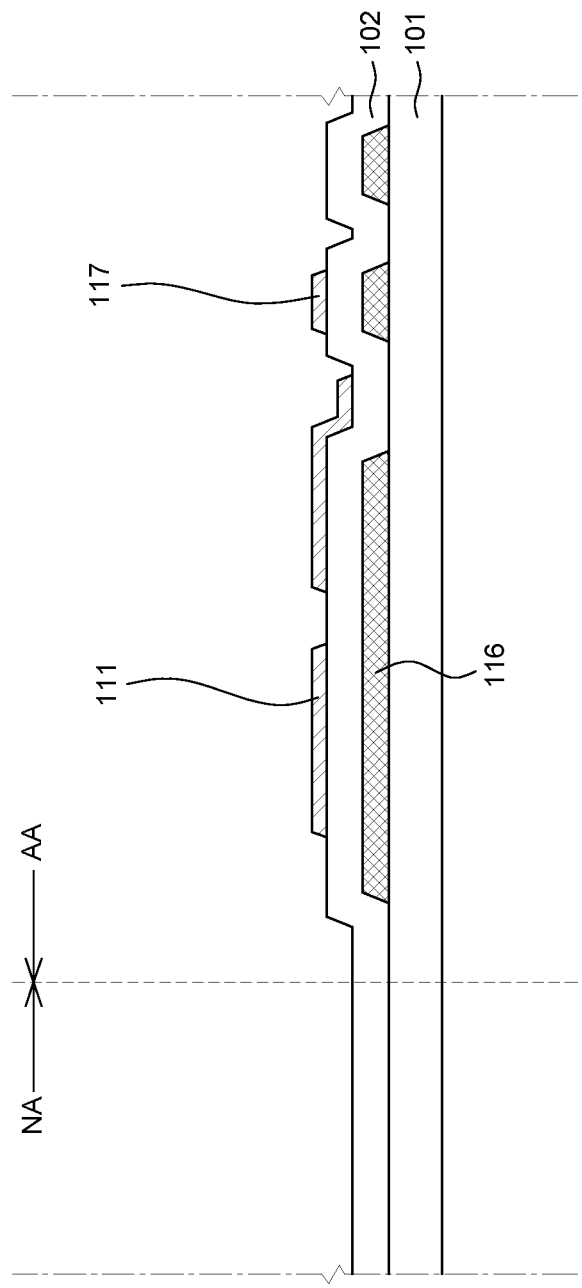
Figure 11B:
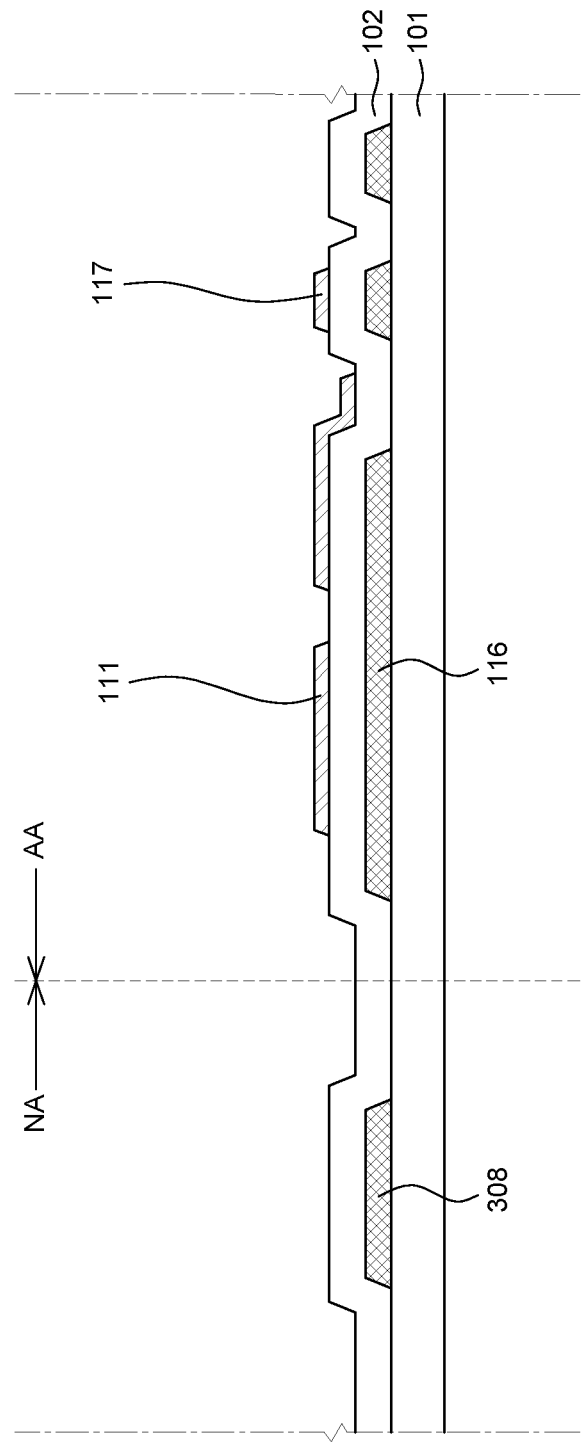

Then, referring to FIG. 10B and FIG. 11B, the active layer 111 may be formed on the buffer layer 102. The active layer 111 may be made of polycrystalline silicon (p-Si) and in this case, a predetermined area may be doped with impurities. Alternatively, the active layer 111 may be made of amorphous silicon (a-Si), or may be made of various organic semiconductor materials such as pentacene. The active layer 111 may also be made of oxide.

Further, the second storage electrode 117 may be formed on the buffer layer 102, but is not limited thereto.

Figure 10C:
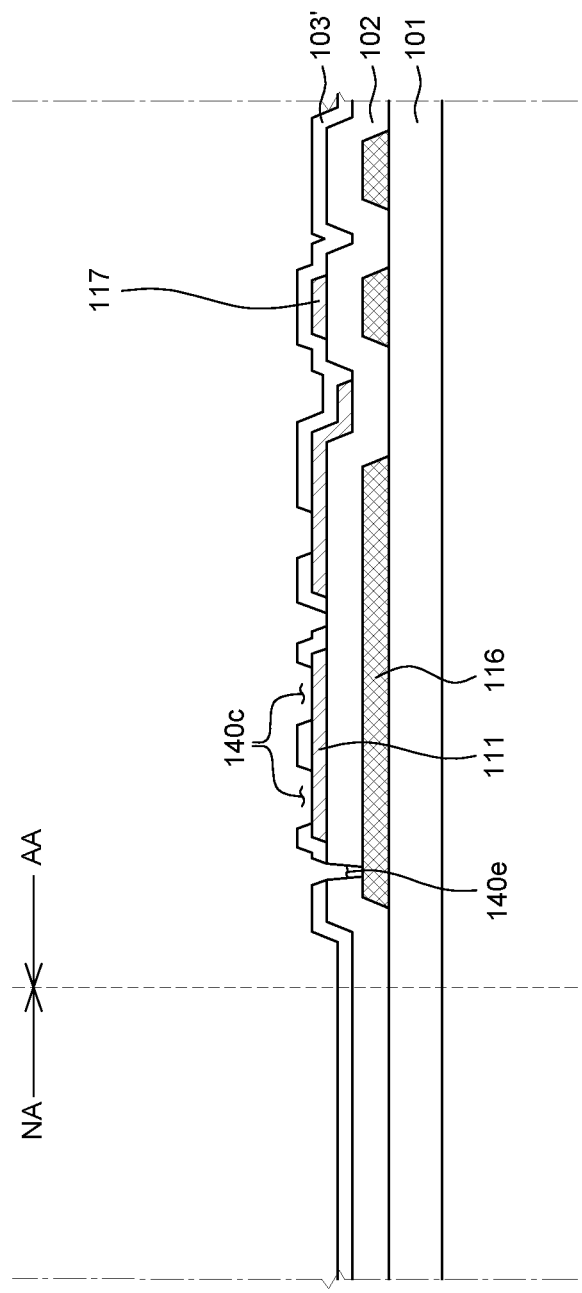
Figure 11C:
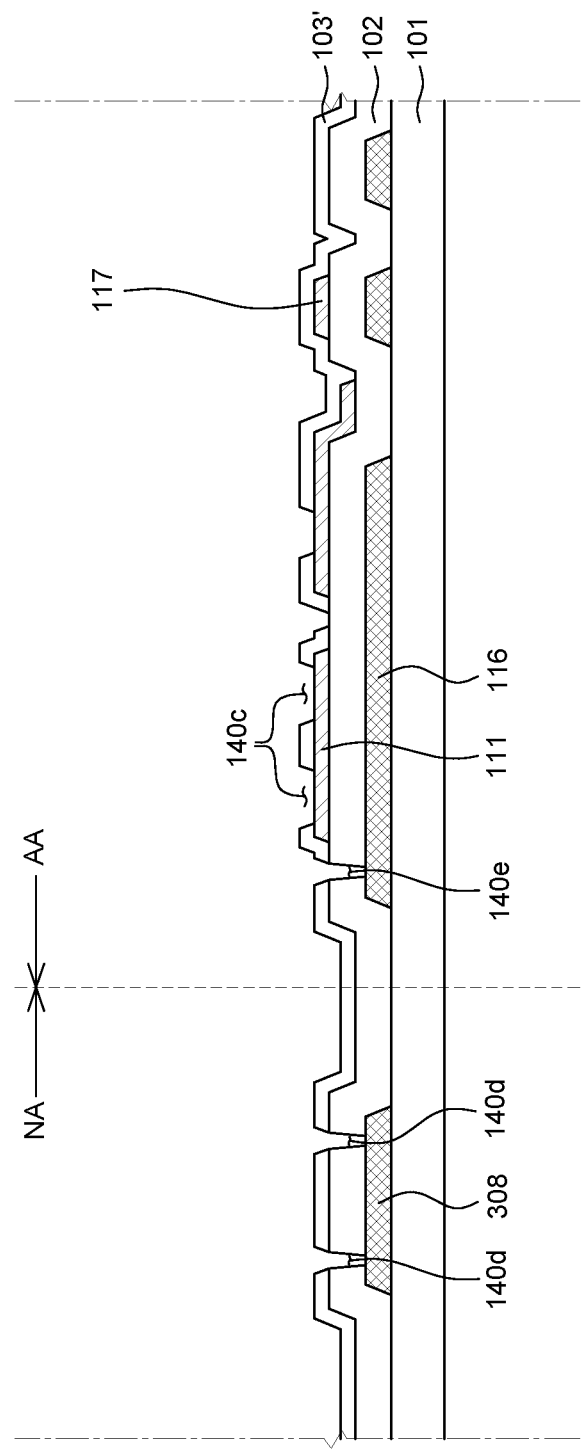

Thereafter, referring to FIG. 10C and FIG. 11C, an insulating layer 103' may be formed on the substrate 101 on which the active layer 111 has been formed.

The insulating layer 103' may be made of an insulating inorganic material such as silicon oxide (SiOx) or silicon nitride (SiNx) to form an interlayer insulating layer, and may also be made of an insulating organic material.

Then, a pair of third contact holes 140c through which a source region and a drain region of the active layer 111 are exposed may be formed by selectively removing a portion of the insulating layer 103'.

Also, a pair of fourth contact holes 140d through which a part of the connection line 308 is exposed may be formed by selectively removing portions of the insulating layer 103' and the buffer layer 102.

The pair of fourth contact holes 140d may expose parts of the left and right sides of the connection line 308.

Further, a fifth contact hole 140e through which a part of the light shielding layer 116 is exposed may be formed by selectively removing portions of the insulating layer 103' and the buffer layer 102.

Figure 10D:
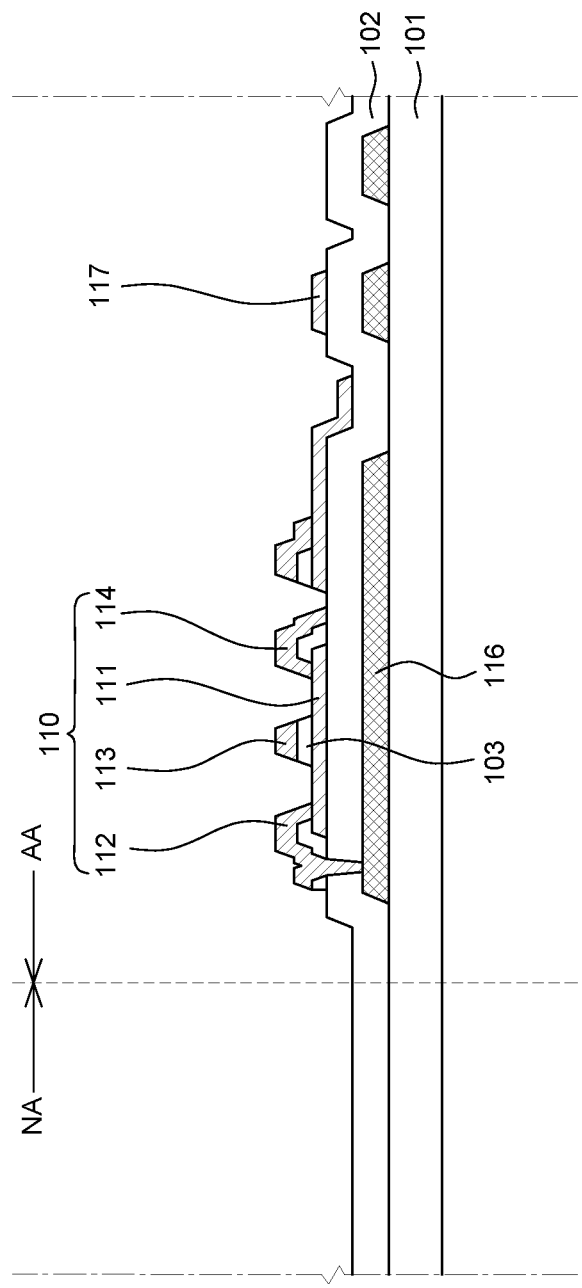
Figure 11D:
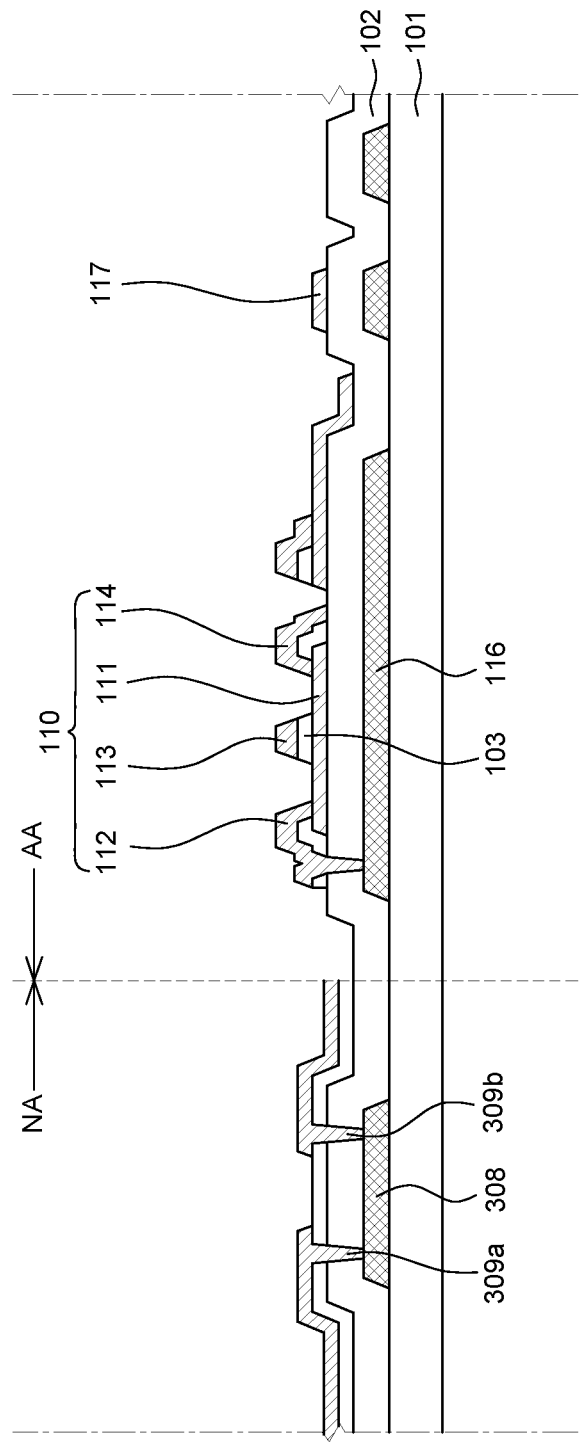

Thereafter, referring to FIG. 10D and FIG. 11D, the gate electrode 113 may be formed on the active layer 111 with the interlayer insulating layer 103 interposed therebetween. Also, the source electrode 114 and the drain electrode 112 electrically connected to the source region and the drain region of the active layer 111 through the third contact holes 140c, respectively, may be formed on the interlayer insulating layer 103.

However, the present disclosure is not limited thereto. After the gate electrode 113 is formed, the source electrode 114 and the drain electrode 112 may also be formed on another layer different from the interlayer insulating layer 103.

Then, the interlayer insulating layer 103 may be formed under the gate electrode 113, the source electrode 114 and the drain electrode 112 by selectively removing the insulating layer 103'.

In this case, the drain electrode 112 may be electrically connected to the light shielding layer 116 thereunder through the fifth contact hole 140e. However, the present disclosure is not limited thereto.

Also, the gate lines 309a and 309b electrically connected to the connection line 308 through the fourth contact holes 140d may be formed on the substrate 101 in the non-display area NA. Due to the bypass structure of the gate lines 309a and 309b, the gate line 309b in the display area AA may be connected to the gate line 309a in the non-display area NA without exposure of the gate lines 309a and 309b by the trench.

Each of the gate electrode 113, the gate lines 309a and 309b, and the source electrode 114 and the drain electrode 112 may be formed as a single layer or a multilayered structure. Each of the gate electrode 113, the gate lines 309a and 309b, and the source electrode 114 and the drain electrode 112 may be made of various conductive materials such as magnesium (Mg), aluminum (Al), nickel (Ni), chromium (Cr), molybdenum (Mo), tungsten (W), gold (Au) or an alloy thereof.

The subsequent process is substantially the same as the manufacturing process according to the first exemplary embodiment shown in FIG. 5A through FIG. 5E and FIG. 6A through FIG. 6G. Therefore, a redundant description thereof will be omitted.

Meanwhile, the under-cut structure and the trench of the present disclosure may be extended toward the data pad area and may be formed not in a column but in two or more columns. This will be described in detail with reference to fourth and fifth exemplary embodiments of the present disclosure.

Figure 12:
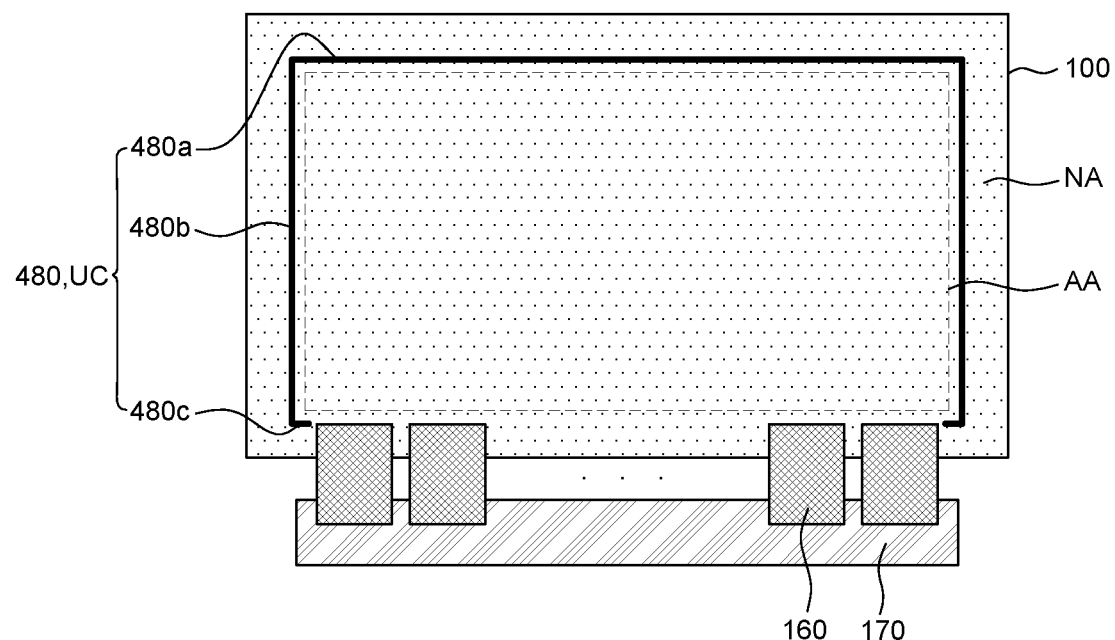
FIG. 12 is a plan view illustrating an electroluminescent display device according to a fourth exemplary embodiment of the present disclosure.

FIG. 12 is a plan view illustrating an electroluminescent display device according to the fourth exemplary embodiment of the present disclosure.

The fourth exemplary embodiment of the present disclosure shown in FIG. 12 is substantially the same as the electroluminescent display device according to the third exemplary embodiment of the present disclosure shown in FIG. 8 except that the under-cut structure UC and a trench 480 are extended toward the data pad area. Therefore, a redundant description thereof will be omitted. The same components will be denoted by the same reference numerals, respectively.

Referring to FIG. 12, the electroluminescent display device according to the fourth exemplary embodiment of the present disclosure may include the display panel 100, the flexible film 160 and the printed circuit board 170.

In the fourth exemplary embodiment of the present disclosure, the trench 480 including the under-cut structure UC is formed in the shadow area within the non-display area NA in the same manner as in the first to third exemplary embodiments. Thus, it is possible to suppress moisture permeation through a lateral surface. Further, since the moisture permeation through the lateral surface may be suppressed or at least reduced, an end of the cathode may retreat toward the display area AA. Therefore, a reliable bezel may be increased, and, thus, a bezel width may be reduced.

Further, in the fourth exemplary embodiment of the present disclosure, a gate line has a bypass structure in the same manner as in the third exemplary embodiment. Therefore, the under-cut structure UC and the trench 480 are formed as a single body (e.g., integrated with each other) on the three sides of the non-display area NA except the lower side of the display panel 100. Accordingly, it is possible to more effectively block or at least reduce a lateral moisture permeation route and thus improve reliability.

Meanwhile, the under-cut structure UC and the trench 480 according to the fourth exemplary embodiment of the present disclosure are extended by a predetermined length toward the data pad area. That is, the under-cut structure UC and the trench 480 formed as a single body (e.g., integrated with each other) may be extended by a predetermined length toward the flexible film 160 in the data pad area. Accordingly, it is possible to more effectively block a lateral moisture permeation route at a corner area.

In this case, the trench 480 may include a first trench 480a disposed on the upper side of the non-display area NA among the four sides of the non-display area NA. Also, the trench 480 may include a second trench 480b disposed on the left and right sides of the non-display area NA and a third trench 480c disposed on the lower side of the non-display area NA. The under-cut structure UC has a similar structure.

The first trench 480a, the second trench 480b and the third trench 480c may be formed as a single body (e.g., integrated with each other).

FIG. 12 illustrates an example where each of the under-cut structure UC and the trench 480 is formed in a column. However, the present disclosure is not limited thereto.

Each of the under-cut structure UC and the trench 480 may be formed in two or more columns. The present disclosure is not limited by the number of columns of under-cut structures UC and trenches 480.

Figure 13:
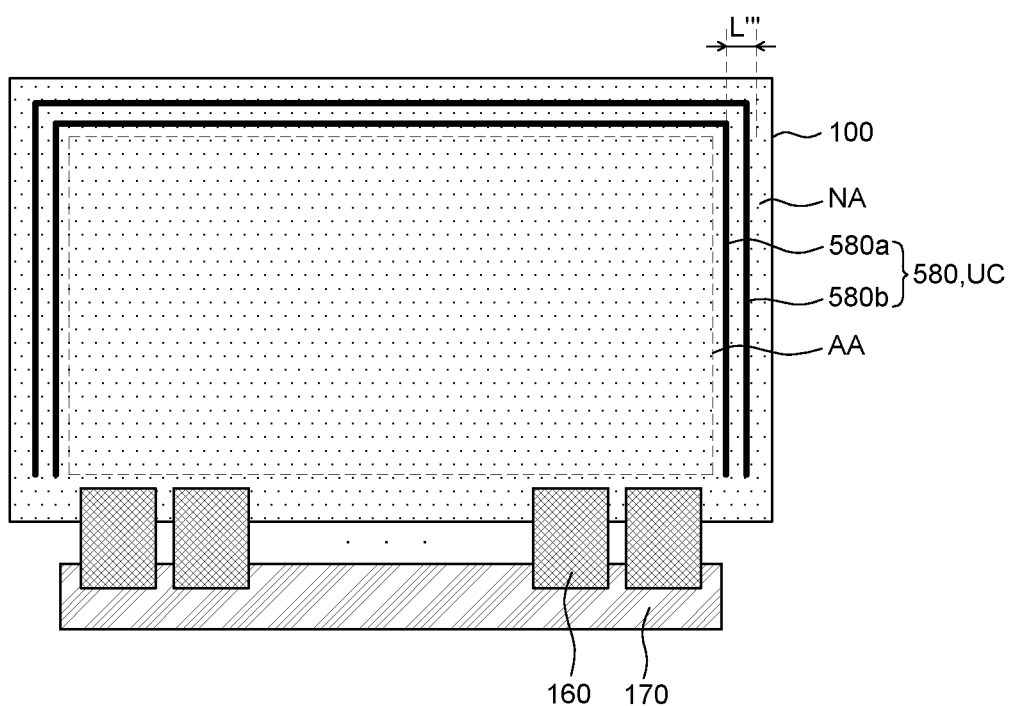
FIG. 13 is a plan view illustrating an electroluminescent display device according to a fifth exemplary embodiment of the present disclosure.

FIG. 13 is a plan view illustrating an electroluminescent display device according to the fifth exemplary embodiment of the present disclosure.

The fifth exemplary embodiment of the present disclosure shown in FIG. 13 is substantially the same as the electroluminescent display device according to the third exemplary embodiment of the present disclosure shown in FIG. 8 except that the under-cut structure UC and a trench 580 are formed not in a column but in two or more columns. Therefore, a redundant description thereof will be omitted. The same components will be denoted by the same reference numerals, respectively.

Referring to FIG. 13, the electroluminescent display device according to the fifth exemplary embodiment of the present disclosure may include the display panel 100, the flexible film 160 and the printed circuit board 170.

In the fifth exemplary embodiment of the present disclosure, the trench 580 including the under-cut structure UC is formed in the shadow area within the non-display area NA in the same manner as in the first to fourth exemplary embodiments. Thus, it is possible to suppress or at least reduce moisture permeation through a lateral surface. Further, since the moisture permeation through the lateral surface may be suppressed, an end of the cathode may retreat toward the display area AA. Therefore, a reliable bezel L" may be increased, and, thus, a bezel width may be reduced.

Further, in the fifth exemplary embodiment of the present disclosure, a gate line has a bypass structure in the same manner as in the third and fourth exemplary embodiments. Therefore, the under-cut structure UC and the trench 580 are formed as a single body (i.e., integrated with each other) on the three sides of the non-display area NA except the lower side of the display panel 100. Accordingly, it is possible to more effectively block a lateral moisture permeation route and thus possible to improve reliability.

Meanwhile, each of the under-cut structure UC and the trench 580 according to the fifth exemplary embodiment of the present disclosure may be formed in two or more columns. The present disclosure is not limited by the number of columns of under-cut structures UC and trenches 580.

The trench 580 may include a first trench 580a located on the inner side and a second trench 580b located on the outer side relatively. The under-cut structure UC has a similar structure.

In particular, in the fifth exemplary embodiment of the present disclosure, the under-cut structure UC and the trench 580 are formed in two or more columns. Thus, the reliable bezel L" is extended from an end of an upper substrate (encapsulation substrate) to the first trench 580a located on the inner side. Accordingly, it is possible to more effectively block or at least reduce a lateral moisture permeation route and thus possible to improve reliability.

The exemplary embodiments of the present disclosure can also be described as follows:

According to an aspect of the present disclosure, there is provided an electroluminescent display device. The electroluminescent display device includes a display panel divided into a display area and a non-display area, a planarization layer and a bank extended to the non-display area of the display panel, an organic layer and a cathode disposed on the bank and extended to the non-display area of the display panel, a trench which is disposed in the non-display area outside the display area and from which the cathode, the organic layer, the bank and the planarization layer are removed, an under-cut structure which is disposed within the trench and composed of the bank and the planarization layer and in which the planarization layer retreats inwards from an end of the bank to generate an under-cut and an adhesive layer and an encapsulation substrate disposed on the cathode.

The under-cut structure and the trench may be disposed on three sides of the non-display area except one side of the display panel connected to a flexible film.

The under-cut structure may be composed of a bank pattern, an anode pattern and a planarization layer pattern made of the same materials as the bank, the anode and the planarization layer within the trench, respectively.

The bank pattern may be disposed on the anode pattern so as to cover the anode pattern.

The organic layer may be extended to the non-display area and disposed on the bank in the non-display area.

The organic layer may be disposed to be spaced apart by a predetermined distance from an end of the bank in the non-display area.

The cathode may be extended to the non-display area and disposed in the non-display area so as to cover a part of the organic layer.

The cathode may be disposed to be spaced apart by a predetermined distance from an end of the organic layer in the non-display area.

Each of the under-cut structure and the trench may be formed in a column.

Each of the under-cut structure and the trench may be formed in two or more columns.

The electroluminescent display device may further include a capping layer disposed on the cathode, wherein an organic layer pattern, a cathode pattern and a capping layer pattern respectively separated (disconnected) from the organic layer, the cathode and the capping layer disposed on the left and right sides of the trench may be disposed on the under-cut structure.

Side surfaces of the bank and the planarization layer may be exposed to left and right side walls of the trench, and the organic layer, the cathode and the capping layer may be disposed to cover the exposed side surfaces of the bank and the planarization layer.

The cathode may be disposed on the left and right side walls of the trench so as to cover a side surface of the organic layer.

The inside of the trench except the under-cut structure may be filled with the adhesive layer.

The electroluminescent display device may further include an inorganic layer made of an inorganic insulating material and disposed on the capping layer including the inside of the trench.

The under-cut structure and the trench may be extended toward the flexible film on the one side of the display panel.

The electroluminescent display device may further include a connection line disposed on a substrate in the non-display area, a buffer layer disposed on the substrate on which the connection line has been disposed and a gate line disposed on the buffer layer, wherein the gate line may be electrically connected to the connection line.

The connection line may pass through under the trench.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display device, comprising:
   a display panel divided into a display area configured to display an image and a non-display area that does not display the image;
   a planarization layer and a bank extending to the non-display area of the display panel;
   an organic layer and a cathode disposed on the bank, the organic layer and the cathode extending to the non-display area of the display panel;
   a trench disposed in the non-display area outside the display area and from which the cathode, the organic layer, the bank and the planarization layer are removed;
   an under-cut structure disposed within the trench, the under-cut structure comprising the bank and the planarization layer such that the planarization layer retreats inwards from an end of the bank to generate an under-cut; and
   an adhesive layer and an encapsulation substrate disposed on the cathode.

2. The electroluminescent display device according to claim 1, wherein the under-cut structure and the trench are disposed on a plurality of sides of the non-display area except a side of the display panel that is connected to a flexible film.

3. The electroluminescent display device according to claim 1, wherein the under-cut structure comprises a bank pattern, an anode pattern, and a planarization layer pattern respectively made of same materials as the bank, an anode, and the planarization layer within the trench.

4. The electroluminescent display device according to claim 3, wherein the bank pattern is disposed on the anode pattern such that the bank pattern covers the anode pattern.

5. The electroluminescent display device according to claim 1, wherein the organic layer extends to the non-display area and is disposed on the bank in the non-display area.

6. The electroluminescent display device according to claim 5, wherein the organic layer is spaced apart by a predetermined distance from an end of the bank in the non-display area.

7. The electroluminescent display device according to claim 1, wherein the cathode extends to the non-display area and covers a part of the organic layer in the non-display area.

8. The electroluminescent display device according to claim 7, wherein the cathode is spaced apart by a predetermined distance from an end of the organic layer in the non-display area.

9. The electroluminescent display device according to claim 1, wherein each of the under-cut structure and the trench is formed in a column.

10. The electroluminescent display device according to claim 1, wherein each of the under-cut structure and the trench is formed in two or more columns.

11. The electroluminescent display device according to claim 1, further comprising:
a capping layer disposed on the cathode,
wherein an organic layer pattern, a cathode pattern and a capping layer pattern respectively separated from the organic layer, the cathode, and the capping layer disposed on a left side and a right side of the trench are disposed on the under-cut structure.

12. The electroluminescent display device according to claim 11, wherein side surfaces of the bank and the planarization layer are exposed to a left side wall and a right side wall of the trench, and the organic layer, the cathode and the capping layer cover exposed side surfaces of the bank and the planarization layer.

13. The electroluminescent display device according to claim 12, wherein the cathode is disposed on the left side wall and the right side wall of the trench and cover a side surface of the organic layer.

14. The electroluminescent display device according to claim 11, wherein an inside of the trench except the under-cut structure is filled with the adhesive layer.

15. The electroluminescent display device according to claim 14, further comprising:
an inorganic layer made of an inorganic insulating material, the inorganic layer disposed on the capping layer and the inside of the trench.

16. The electroluminescent display device according to claim 2, wherein the under-cut structure and the trench extend toward the flexible film on the side of the display panel.

17. The electroluminescent display device according to claim 1, further comprising:
a connection line disposed on a substrate in the non-display area;
a buffer layer disposed on the substrate on which the connection line is disposed; and
a gate line disposed on the buffer layer,
wherein the gate line is electrically connected to the connection line.

18. The electroluminescent display device according to claim 17, wherein the connection line passes under the trench.

* * * * *